United States Patent
Yoshida et al.

(10) Patent No.: US 9,356,135 B2
(45) Date of Patent: May 31, 2016

(54) SEMICONDUCTOR DEVICE AND METHOD OF MANUFACTURING THE SAME

(71) Applicant: RENESAS ELECTRONICS CORPORATION, Kanagawa (JP)

(72) Inventors: Kosuke Yoshida, Kanagawa (JP); Tetsuya Nitta, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/605,027

(22) Filed: Jan. 26, 2015

(65) Prior Publication Data
US 2015/0214356 A1 Jul. 30, 2015

(30) Foreign Application Priority Data

Jan. 27, 2014 (JP) ................................ 2014-012301

(51) Int. Cl.
*H01L 29/66* (2006.01)
*H01L 29/78* (2006.01)
*H01L 29/06* (2006.01)
*H01L 29/10* (2006.01)

(52) U.S. Cl.
CPC .......... *H01L 29/7813* (2013.01); *H01L 29/063* (2013.01); *H01L 29/1095* (2013.01); *H01L 29/66734* (2013.01)

(58) Field of Classification Search
CPC ............ H01L 29/1095; H01L 29/7813; H01L 29/0634; H01L 29/0696; H01L 29/0878; H01L 29/063; H01L 29/7811; H01L 29/42368; H01L 29/0619; H01L 29/41766; H01L 29/0615; H01L 29/66734; H01L 29/4236; H01L 29/407
USPC .................................................... 257/33, 330
See application file for complete search history.

(56) References Cited

U.S. PATENT DOCUMENTS 6,072,215 A 6/2000 Kawaji et al.
6,835,993 B2 * 12/2004 Sridevan et al. .............. 257/492
(Continued)

FOREIGN PATENT DOCUMENTS

JP 11-274493 A 10/1999

*Primary Examiner* — Jessica Stultz
*Assistant Examiner* — Vu A Vu
(74) *Attorney, Agent, or Firm* — McDermott Will & Emery LLP

(57) ABSTRACT

To provide a semiconductor device capable of suppressing a reduction in breakdown voltage by suppressing a change in dimensions of a double RESURF structure, and a method of manufacturing the same.
In the semiconductor device, an upper RESURF region is formed so as to contact with a first buried region on a side of the one main surface within a semiconductor substrate. The semiconductor substrate has a field oxide formed so as to reach the upper RESURF region on the one main surface. The semiconductor substrate includes a second conductivity type body region formed so as to contact with the upper RESURF region on a side of the one main surface and so as to neighbor the field oxide within the semiconductor substrate.

20 Claims, 24 Drawing Sheets

(56) References Cited

U.S. PATENT DOCUMENTS

| | | | |
|---|---|---|---|
| 7,023,050 B2* | 4/2006 | Salama | H01L 29/0634 257/335 |
| 7,535,057 B2* | 5/2009 | Yang | 257/335 |
| 7,871,888 B2* | 1/2011 | Nishimura | H01L 29/0615 257/335 |
| 8,299,524 B2* | 10/2012 | Takaishi | H01L 29/7813 257/333 |
| 8,513,732 B2* | 8/2013 | Blanchard | H01L 22/26 257/330 |
| 2008/0001198 A1* | 1/2008 | Jeon | H01L 29/0634 257/298 |
| 2013/0015493 A1* | 1/2013 | Senoo | H01L 29/7395 257/133 |
| 2013/0093015 A1* | 4/2013 | Pal | H01L 29/165 257/339 |
| 2013/0105887 A1* | 5/2013 | Zuniga | H01L 29/66704 257/330 |
| 2014/0353683 A1* | 12/2014 | Ishimabushi | H01L 29/1608 257/77 |
| 2014/0374871 A1* | 12/2014 | Hirabayashi | H01L 29/404 257/488 |

* cited by examiner

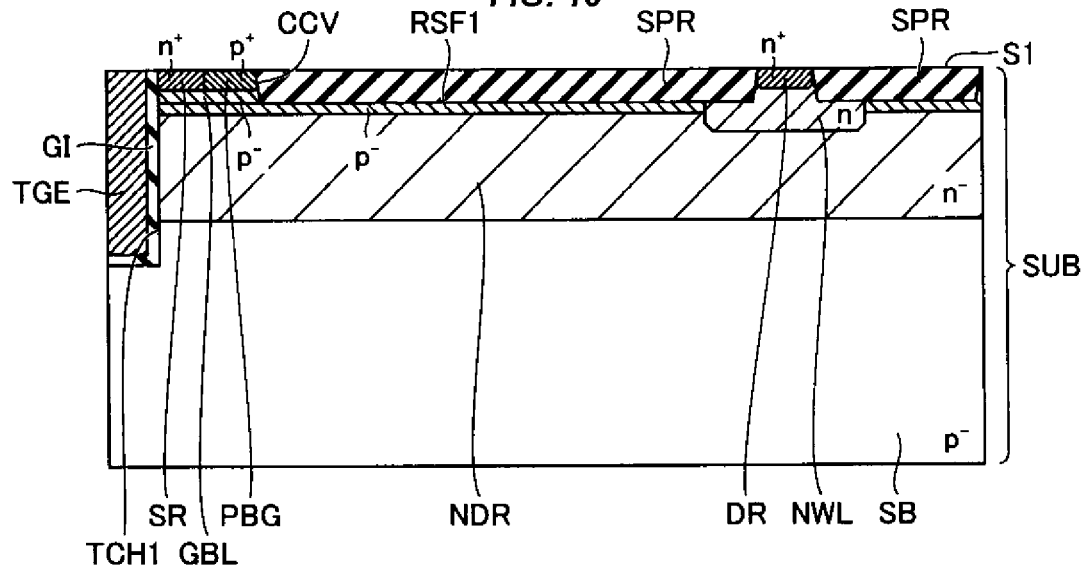
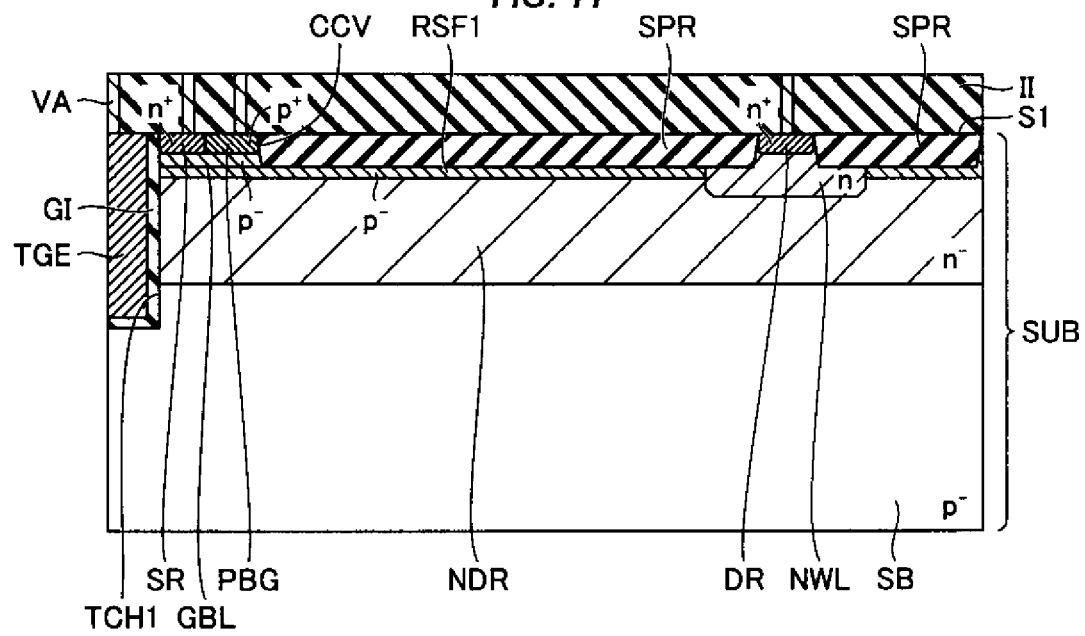

SEMICONDUCTOR DEVICE AND METHOD OF MANUFACTURING THE SAME

CROSS-REFERENCE TO RELATED APPLICATION

The disclosure of Japanese Patent Application No. 2014-012301 filed on Jan. 27, 2014 including the specification, drawings and abstract is incorporated herein by reference in its entirety.

BACKGROUND

The present invention relates to a semiconductor device and a method of manufacturing the same, and particularly, to a semiconductor device having a so-called double RESURF structure and a method of manufacturing the same.

In an examination of a high breakdown voltage LDMOS (Laterally Diffused Metal Oxide Semiconductor), it has been found out that the configuration obtained by combining the lateral MOS transistor having a vertical channel trench gate structure as illustrated in, for example, Japanese Patent Laid-Open No. 1999-274493 (Patent Literature 1) and a so-called double RESURF (REduced SURface Field) structure has a high consistency. In other words, by having the vertical direction channel by the trench gate, it is possible to reduce the area occupied by the whole transistor, and therefore, it is possible to promote miniaturization of the transistor. Further, by utilizing the improved breakdown voltage achieved by taking advantage of the double RESURF structure which tends to cause depletion, it is possible to increase the doping concentration in the drift region configuring the double RESURF structure and to achieve a reduction in the on-resistance of the transistor.

SUMMARY

In general, the dimensions of the double RESURF structure are in proportion to the breakdown voltage of the transistor, and therefore, preferably, the transistor is designed so that the ratio of the dimension of the double RESURF structure to the dimension of the whole transistor is high while reducing the dimensions of the whole transistor.

Further, in the above-described transistor structure, an impurity region called a body region is formed in the vicinity of the source region in order to control a threshold voltage. If the body region and one of the RESURF layers configuring the double RESURF structure are located side by side along the main surface of the semiconductor substrate as the same layer, for example, the impurities in the body region diffuse in the region of the double RESURF structure, and therefore, there is a possibility that the dimensions of the double RESURF structure will be changed (reduced) and the breakdown voltage of the transistor will be reduced.

Furthermore, if the above-described body region and one of the RESURF layers of the double RESURF structure are formed in different processes by using different masks, the process efficiency is reduced. No measures against such problems have been disclosed or suggested in Patent Literature 1, and besides, Patent Literature 1 has not disclosed the double RESURF structure at all.

The other tasks and the new feature will become clear from the description of the present specification and the accompanying drawings.

In a semiconductor device according to an embodiment, an upper RESURF region is formed so as to contact with a first buried region on a side of the one main surface within a semiconductor substrate. The semiconductor substrate has a field oxide formed so as to reach the upper RESURF region on the one main surface. A second conductivity type body region is formed so as to contact with the upper RESURF region on a side of the one main surface and so as to neighbor the field oxide.

In a method of manufacturing a semiconductor device according to an embodiment, a second conductivity type upper RESURF region is formed so as to contact with a first buried region on a side of the one main surface within a semiconductor substrate. A second conductivity type body region is formed so as to contact with the upper RESURF region on a side of the one main surface and so as to neighbor a field oxide within the semiconductor substrate. The upper RESURF region and the body region are formed by introducing second conductivity type impurities by using the same pattern as a mask.

According to the semiconductor device of the embodiment, the body region is formed so as to contact with the upper RESURF region on a side of the one main surface of the semiconductor substrate. Because the body region neighbors the field oxide, the possibility of dimensional change in the upper RESURF region due to the diffusion of the body region in the main surface direction is eliminated. Because of this, the change in the dimensions of the double RESURF structure formed by the upper RESURF region and a lower RESURF region is suppressed, and therefore, it is possible to provide a semiconductor device having a stable breakdown voltage.

According to the manufacturing method of the embodiment, the upper RESURF region and the body region are formed by using the same pattern as a mask, and therefore, it is possible to improve the process efficiency.

BRIEF DESCRIPTION OF THE DRAWINGS

FIG. 10 is a schematic section view illustrating an eighth process of the method of manufacturing the semiconductor device according to the First Embodiment;

FIG. 11 is a schematic section view illustrating a ninth process of the method of manufacturing the semiconductor device according to the First Embodiment;

DETAILED DESCRIPTION

Hereinafter, embodiments are explained based on the drawings.

(First Embodiment)

Figure 1:
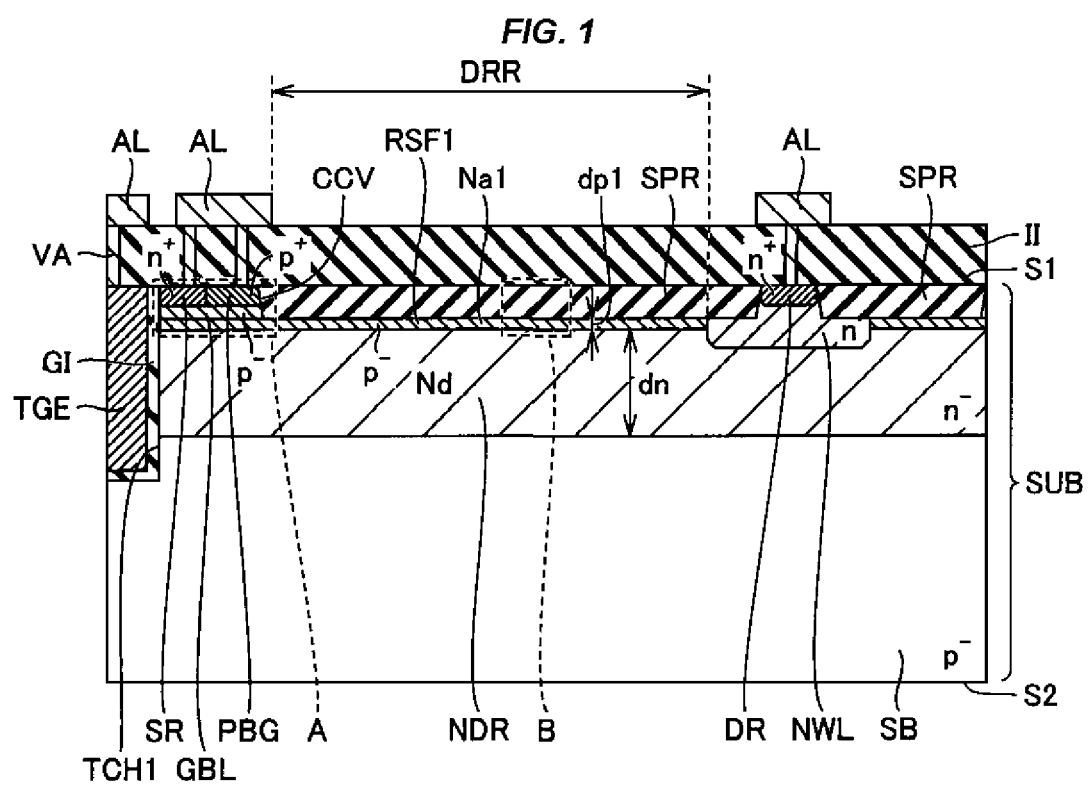
FIG. 1 is a section view schematically illustrating a configuration of a semiconductor device of a First Embodiment.

First, by using FIG. 1, a configuration of a semiconductor device of the present embodiment is explained.

Referring to FIG. 1, the semiconductor device of the present embodiment has an LDMOS transistor (lateral insulating gate type field effect transistor). The semiconductor device mainly has a semiconductor substrate SUB, an n-type drift region NDR (first buried region), a p-type RESURF region RSF1 (upper RESURF region), a field oxide SPR, a p-type body region GBL (body region), and a trench gate electrode TGE (gate electrode).

The semiconductor substrate SUB is formed by, for example, a substrate region SB including silicon containing p-type impurities and has one main surface (main surface S1 on the upper side in FIG. 1) and the other main surface (main surface S2 on the lower side in FIG. 1) being opposed to each other. In FIG. 1, a substrate region SB arranged on the main surface S2 side within the semiconductor substrate SUB is arranged as a lower RESURF region.

The drift region NDR containing n-type (first conductivity type) impurities is formed so as to contact with the main surface S1 side of the substrate region SB as the lower RESURF region within the semiconductor substrate SUB. Preferably, the n-type drift region NDR is formed so as to reach the region whose depth in the direction from the main surface S1 toward the main surface S2 of the semiconductor substrate SUB is about 2 μm. The n-type drift region NDR is formed so as to extend, for example, throughout substantially the whole region within the semiconductor substrate SUB except for the region in which the trench gate electrode TGE is formed with respect to the direction along the main surface of the semiconductor substrate SUB.

The p-type RESURF region RSF1 is an upper RESURF region containing p-type (second conductivity type) impurities formed so as to contact with the main surface S1 side of the n-type drift region NDR. The p-type RESURF region RSF1 is formed so as to extend, for example, throughout substantially the whole region within the semiconductor substrate SUB except for the regions in which the trench gate electrode TGE and an n-type well region NWL, to be described later, are formed with respect to the direction along the main surface of the semiconductor substrate SUB.

In part of the main surface S1 of the semiconductor substrate SUB, a concavity CCV is formed so as to reach the p-type RESURF region RSF1 and the field oxide SPR is formed by an insulating film, such as a silicon oxide film, to be buried within the concavity CCV.

Within the semiconductor substrate SUB, in the region neighboring the concavity CCV and the field oxide SPR with respect to the direction along the main surface of the semiconductor substrate SUB, the body region GBL containing p-type impurities is formed so as to contact with the main surface S1 side of the p-type RESURF region RSF1. More specifically, on the main surface S1 side of the p-type RESURF region RSF1, the p-type body region GBL is formed so as to contact with the top surface of the p-type RESURF region RSF1, which is a portion of the p-type RESURF region RSF1 not arranged directly under the field oxide SPR.

In the region of the main surface S1 of the semiconductor substrate SUB, which neighbors the p-type body region GBL and the p-type RESURF region RSF1, a gate trench TCH1 is formed. The gate trench TCH1 extends in the direction intersecting the main surface S1 (e.g., in the vertical direction) so as to penetrate through the region neighboring the p-type body region GBL and the p-type RESURF region RSF1 and to reach at least the n-type drift region NDR.

On the bottom sidewall of the gate trench TCH1, a gate insulating film GI including, for example, a silicon oxide film, is formed. Within the gate trench TCH1, the trench gate electrode TGE is formed so as to contact with the top surface of the gate insulating film GI. The trench gate electrode TGE is arranged so as to oppose the p-type body region GBL and the p-type RESURF region RSF1 with the gate insulating film GI being interposed in between. The trench gate electrode TGE is formed so as to penetrate through the regions neighboring the p-type body region GBL and the p-type RESURF region RSF1 from the main surface S1 and to reach at least the n-type drift region NDR, but here, the trench gate electrode TGE is formed so as to penetrate through the n-type drift region NDR and to reach the substrate region SB.

Besides the above, in the semiconductor device of the present embodiment, for example, an n-type source region SR and a p-type back gate region PBG are formed so as to be located side by side in the direction along the main surface on the main surface S1 of the semiconductor substrate SUB so as to contact with, for example, the main surface S1 side of the p-type body region GBL. Preferably, the source region SR is arranged on the side closer to the trench gate electrode TGE (on the left side in FIG. 1) than the back gate region PBG. Further, the source region SR and the back gate region PBG may be in contact with each other. Consequently, with respect to the vertical direction in FIG. 1, the p-type body region GBL is formed so as to be sandwiched by the source region SR and the back gate region PBG, and the p-type RESURF region RSF1.

On the main surface S1 of the semiconductor substrate SUB, a drain region DR is formed spaced from the above-described region such as n-type source region SR and the p-type body region GBL, with respect to the direction along the main surface. In the region between the source region SR and the drain region DR, the field oxide SPR extends along the direction of the main surface S1. Preferably, the source region SR, the drain region DR, and the p-type back gate region PBG have an n-type or p-type doping concentration higher ($n^+$ region/$p^-$ region) than that in the n-type drift region NDR ($n^-$ region) and the p-type RESURF region RSF1 ($p^-$ region).

Directly under the drain region DR, the n-type well region NWL (well region) is formed within the semiconductor substrate SUB so as to planarly surround the drain region DR (in a planar view). In FIG. 1, the n-type well region NWL has a shape that extends in the downward direction from directly under the drain region DR and spreads in the direction along the main surface in the lower part, but the shape is not limited to this, and, for example, the n-type well region NWL may be formed so as to surround the drain region DR on the main surface S1. Preferably, the n-type well region NWL is a region (n region) in which the n-type doping concentration is higher than that in the n-type drift region NDR.

By reaching the n-type drift region NDR closer to the main surface S2 side than the p-type RESURF region RSF1, the n-type well region NWL is electrically coupled with the n-type drift region NDR and allows the current flowing through the n-type drift region NDR to flow up to the drain region DR. However, the n-type well region NWL is preferably formed so as to have its bottom part in the region (closer to the main surface S1 side) shallower than the region in the lowest part of the n-type drift region NDR, that is, in the region closest to the main surface S2 of the n-type drift region NDR. Specifically, the depth of the n-type well region NWL is preferably about 1 μm and the n-type doping concentration is not less than $8 \times 10^{16}$ cm$^{-3}$ and not more than $2 \times 10^{17}$ cm$^{-3}$.

An interlayer insulating film II is formed so as to cover the main surface S1 of the semiconductor substrate SUB (the trench gate electrode TGE, the gate insulating film GI, the source region SR, the p-type back gate region PBG, the field oxide SPR, and the drain region DR). The interlayer insulating film II includes, for example, a silicon oxide film. Over the interlayer insulating film II, a patterned metal wiring AL is formed. The metal wiring AL is electrically coupled with the trench gate electrode TGE, the source region SR, the p-type back gate region PBG, and the drain region DR on the main surface S1 of the semiconductor substrate SUB through a conductive layer, called a via VA formed in the interlayer insulating film II.

In the LDMOS transistor having the configuration such as described above, when it drives, the p-type body region GBL directly under the source region SR and the p-type RESURF region RSF1 directly thereunder produce the electric field effect by the voltage applied to the trench gate electrode TGE neighboring these regions and the conductivity type is reversed, and thus an n-type channel is formed. Accordingly, a current path from the source region SR to the drain region DR via the p-type body region GBL, the p-type RESURF region RSF1, and the n-type drift region NDR is formed.

The lower side (the main surface S2 side) of the n-type drift region NDR through which the above-described current flows is in contact with the p-type substrate region SB and the upper side (the main surface S1 side) thereof is in contact with the p-type RESURF region RSF1. In other words, a so-called double RESURF structure having two pn junctions is formed by the n-type drift region NDR and the substrate region SB and the p-type RESURF region RSF1 joined so as to sandwich the n-type drift region NDR from both sides in the vertical direction thereof. Accordingly, in the n-type drift region NDR, when it holds the breakdown voltage, a depletion layer is formed both at the pn junction part with the substrate region SB and at the pn junction part with the p-type RESURF region RSF1, and therefore, depletion is promoted compared to that in the normal drift region (e.g., having only the single pn junction) and the breakdown voltage between the source region SR and the drain region DR is improved. Further, in the n-type drift region NDR, depletion easily occurs, and therefore, by increasing the n-type doping concentration higher than that in the normal drift region, it is possible to reduce the on-resistance.

It is possible to increase the breakdown voltage between the source region SR and the drain region DR in proportion to the dimension of a double RESURF region DRR in the direction along the main surface of the semiconductor substrate SUB, which configures the double RESURF structure in which the n-type drift region NDR is sandwiched by the p-type regions from both sides in the vertical direction.

Next, the relationship between the dimension in the depth direction of each region and the doping concentration of the present embodiment is explained. In the present embodiment, if the n-type doping concentration in the n-type drift region NDR is taken to be Nd ($cm^{-3}$) and the depth of the n-type drift region NDR is taken to be dn (cm), the relationship $4 \times 10^{12} \leq Nd \times dn \leq 8 \times 10^{12}$ holds.

Further, if the p-type doping concentration in the p-type RESURF region RSF1 is taken to be Na1 ($cm^{-3}$) and the depth of the p-type RESURF region RSF1 is taken to be dp1 (cm), the relationship $2 \times 10^{12} \leq Na1 \times dp1 \leq 4 \times 10^{12}$ holds. This is a preferred condition when setting the breakdown voltage of the double RESURF region DRR to an appropriate value.

Next, with reference to FIG. 2A, FIG. 2B, FIG. 3A and FIG. 3B, the doping concentration distribution in the p-type body region GBL and the p-type RESURF region RSF1 is explained.

Figure 2A:
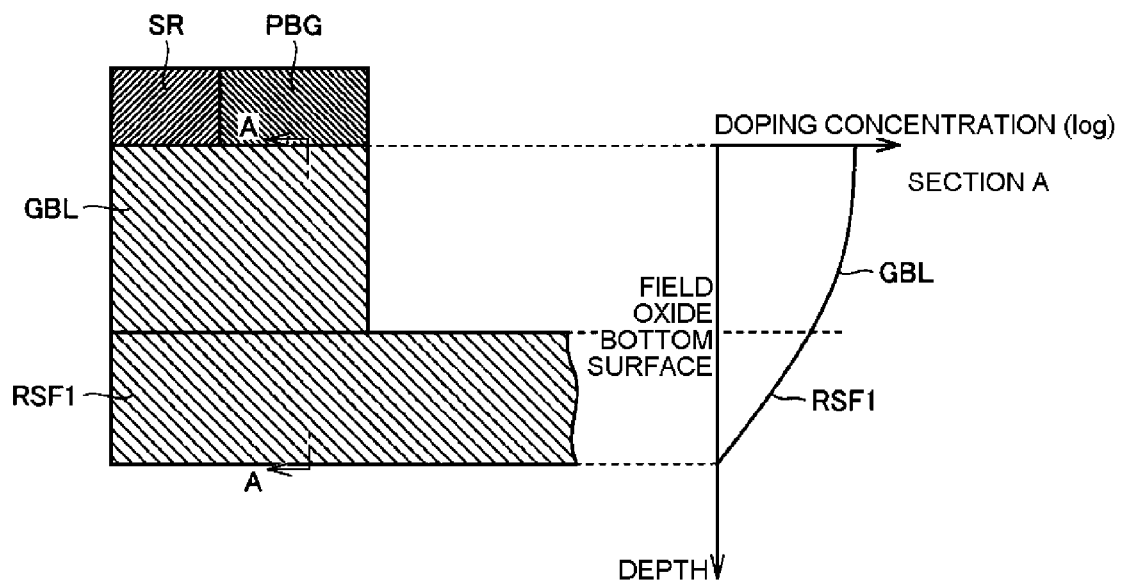
FIG. 2A an enlarged view of a region surrounded by a dot line A in FIG. 1 and a graph indicating a p-type doping concentration distribution of a portion along an A-A line within the region.
Figure 2B:
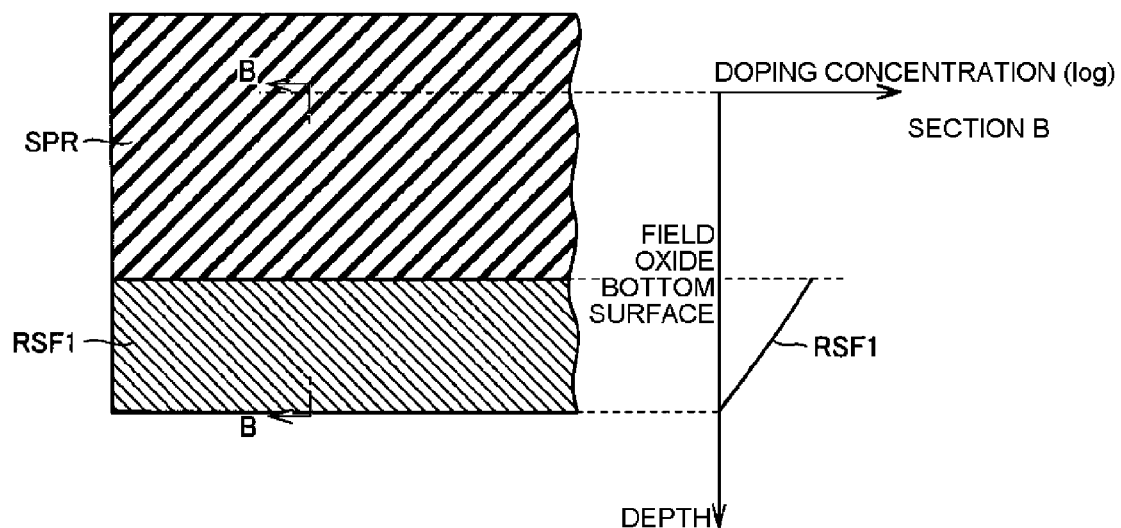
FIG. 2B is an enlarged view of a region surrounded by a dot line B in FIG. 1 and a graph indicating a p-type doping concentration distribution of a portion along a B-B line within the region, in a case where a p-type body region and a p-type RESURF region are formed simultaneously.

Referring to FIGS. 2A and 2B, in the present embodiment, the p-type body region GBL is formed so as to contact with the top surface of the p-type RESURF region RSF1, but both may be formed simultaneously by a same ion implantation (by performing ion implantation once).

Over the top surface of the p-type RESURF region RSF1, the field oxide SPR and the p-type body region GBL are formed so as to be located side by side. In this case, the p-type doping concentration distribution in the portion along the A-A line in FIG. 2A, that is, in the region in which the p-type RESURF region RSF1 and the p-type body region GBL are in contact with each other, is continuous at the boundary between the p-type RESURF region RSF1 and the p-type body region GBL directly thereover. Then, basically, the doping concentration becomes lower in the region deeper with respect to the main surface S1. On the other hand, the p-type doping concentration distribution in the p-type RESURF region RSF1 in the portion along the B-B line in FIG. 2B, that is, in the region in which the p-type RESURF region RSF1 and the field oxide SPR are in contact with each other, is basically the same as the p-type doping concentration distribution in the p-type RESURF region RSF1 in the region in contact with the p-type body region GBL if the depth is the same. However, there is a case where the p-type RESURF region RSF1 under the field oxide SPR has a concentration lower than that in the p-type RESURF region RSF1 under the p-type body region GBL.

In the case in FIGS. 2A and 2B, the boundary between the p-type RESURF region RSF1 and the p-type body region GBL in the portion along the A-A line is defined as the position whose depth is the same as that of the bottom surface of the field oxide SPR.

Figure 3A:
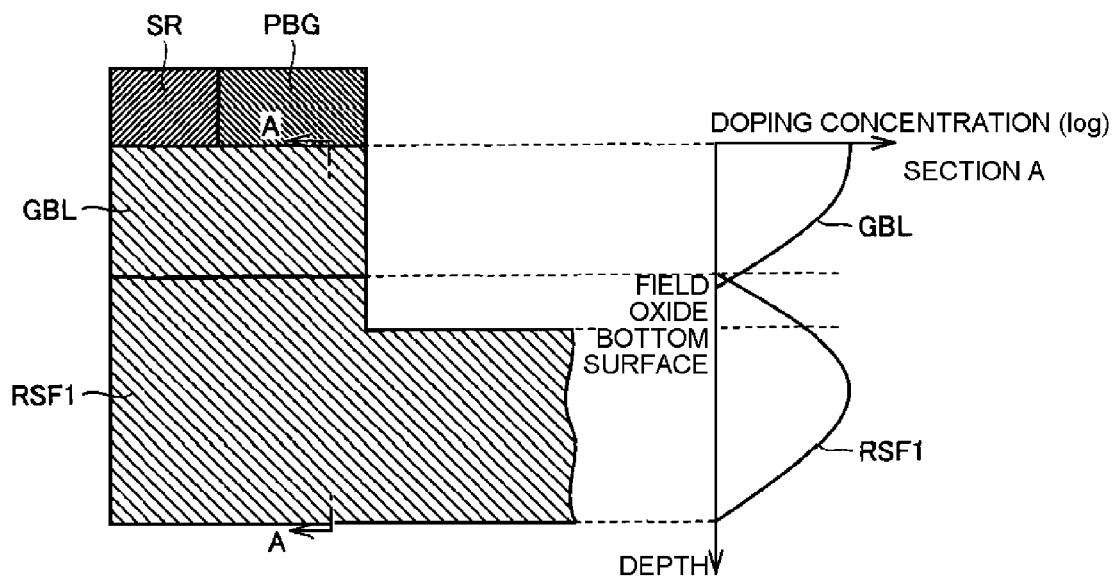
FIG. 3A an enlarged view of the region surrounded by the dot line A in FIG. 1 and a graph indicating a p-type doping concentration distribution of the portion along the A-A line within the region, and 3B is an enlarged view of the region surrounded by the dot line B in FIG. 1 and a graph indicating a p-type doping concentration distribution of the portion along the B-B line within the region, in a case where the p-type body region and the p-type RESURF region are formed separately.
Figure 3B:
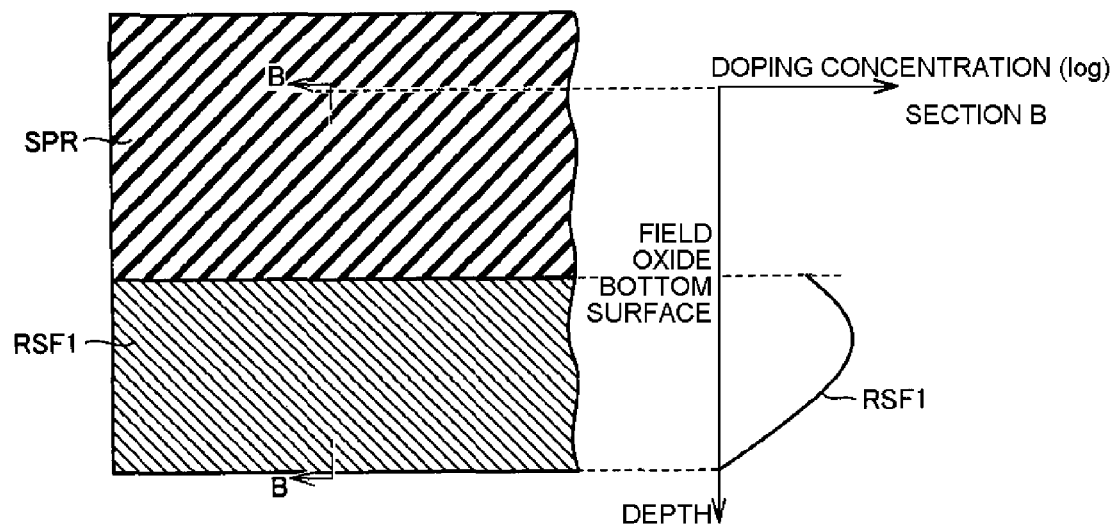

Referring to FIGS. 3A and 3B, in the present embodiment, the p-type body region GBL and the p-type RESURF region RSF1 may be formed separately by ion implantations different from each other (by performing ion implantations twice). In this case, the position corresponding to the intersection of the graph of the ion implantation concentration distribution for forming the p-type body region GBL illustrated in FIG. 3A and the graph of the ion implantation concentration distribution for forming the p-type RESURF region RSF1 is defined as the boundary between the p-type RESURF region RSF1 and the p-type body region GBL in the portion along the A-A line. In this case, normally as illustrated in FIG. 3, the boundary is formed in a region somewhat shallower than the bottom surface of the field oxide SPR.

As described above, depending on the ion implantation method, the position of the boundary between the p-type RESURF region RSF1 and the p-type body region GBL varies somewhat, but hereinafter in the present embodiment, each drawing is illustrated on an assumption that the boundary appears at the bottom surface of the field oxide SPR as in FIGS. 2A and 2B.

Next, by using FIG. 4 to FIG. 14, a method of manufacturing the semiconductor device of the present embodiment illustrated in FIG. 1 is explained.

Figure 4:
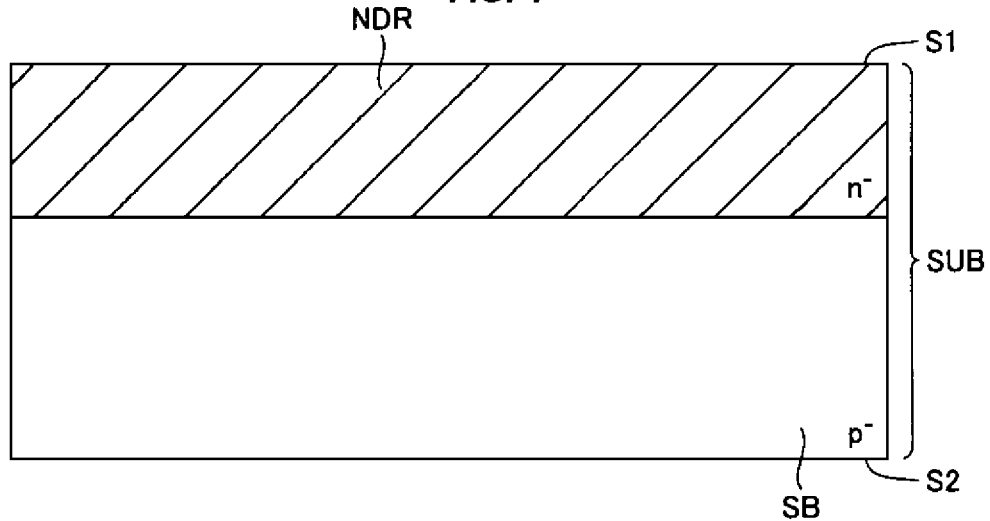
FIG. 4 is a schematic section view illustrating a first process of a method of manufacturing a semiconductor device according to the First Embodiment.

Referring to FIG. 4, first, the semiconductor substrate SUB including silicon is prepared, which has the one main surface S1 and the other main surface S2 being opposed to each other. Here, the semiconductor substrate SUB including the substrate region SB containing p-type impurities is prepared.

Next, from the main surface S1 side of the semiconductor substrate SUB, the n-type drift region NDR is formed within the semiconductor substrate SUB by using the normal ion implantation technique. Specifically, impurity ions of phosphorus are implanted into the semiconductor substrate SUB aiming at the range whose depth is, for example, not less than 1 μm and not more than 2 μm from the main surface S1 (so that the peak of the concentration appears mainly in this range). After that, for example, by performing the thermal processing in which heating at about 1,200° C. is continued for about five hours, the n-type drift region NDR containing impurity ions of phosphorus, which are n-type impurities, is formed within the range whose depth from the main surface S1 is about 2 μm.

In FIG. 4, the n-type drift region NDR is formed in the whole region within the range whose depth is about 2 μm from the main surface S1 of the semiconductor substrate SUB, but the n-type drift region NDR may be to formed only in the region at a desired depth from the main surface S1 in such a manner as to be buried inside the semiconductor substrate SUB.

Accordingly, the substrate region SB on the main surface S2 side of the n-type drift region NDR is formed as a lower RESURF region of the n-type drift region NDR being in contact with the lower side of the n-type drift region NDR, and this can be represented in the opposite way such that the n-type drift region NDR is formed so as to contact with the main surface S1 side of the substrate region SB.

Figure 5:
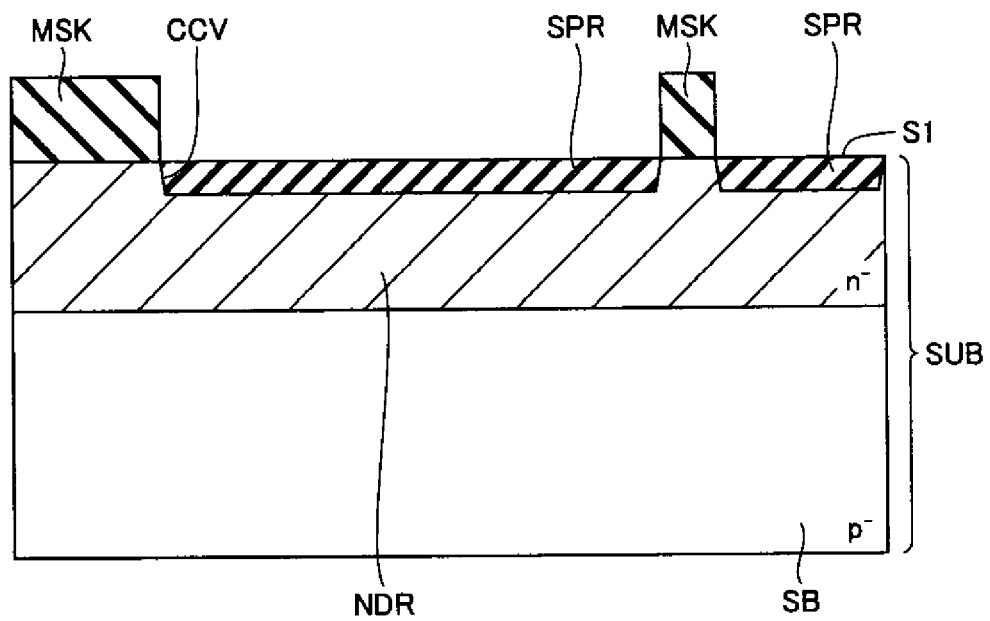
FIG. 5 is a schematic section view illustrating a second process of the method of manufacturing the semiconductor device according to the First Embodiment.

Referring to FIG. 5, by a normal photolithography technique and an etching technique, a mask pattern MSK including, for example, a silicon nitride film, is formed over the main surface S1 of the semiconductor substrate SUB. Next, by using the mask pattern MSK as a mask, by use of the normal photolithography technique and the etching technique, a concavity CCV is formed on the main surface S1 of the semiconductor substrate SUB. In the case where the n-type drift region NDR is formed, in particular, in the depth direction from the main surface S1, the concavity CCV is formed so as to remove a part of the n-type drift region NDR formed on the main surface S1, but the bottom part thereof is formed in the region shallower than the lowest part of the n-type drift region NDR. In other words, also in the region in which the concavity CCV is formed, the n-type drift region NDR is formed directly under the concavity CCV.

Subsequently, over the main surface S1, for example, a silicon oxide film is formed by a normal CVD (Chemical Vapor Deposition) method so as to fill in the concavity CCV. After that, the silicon oxide film over the main surface S1 is ground by, for example, a chemical mechanical polishing method, simply called as CMP, so that the top surface is flattened and the excessive silicon oxide film that bulges out of, for example, the concavity CCV is removed. Accordingly, the field oxide SPR is formed within the concavity CCV. After the field oxide SPR is formed, the mask pattern MSK is removed.

The field oxide SPR may also be formed by a so-called LOCOS (LOCal Oxidation of Silicon) method in place of the above-described method. In this case, for example, a silicon oxide film pattern formed by the normal thermal oxidation processing method over the main surface S1 by using, for example, the mask pattern MSK formed in FIG. 5, is oxidized again, and therefore, the silicon oxide film grows and increases in thickness, and thus the field oxide SPR is formed. In this case also, the field oxide SPR exhibits such an aspect as if the inside of the concavity CCV is filled with an insulating film, basically the same as in FIG. 1.

Figure 6:
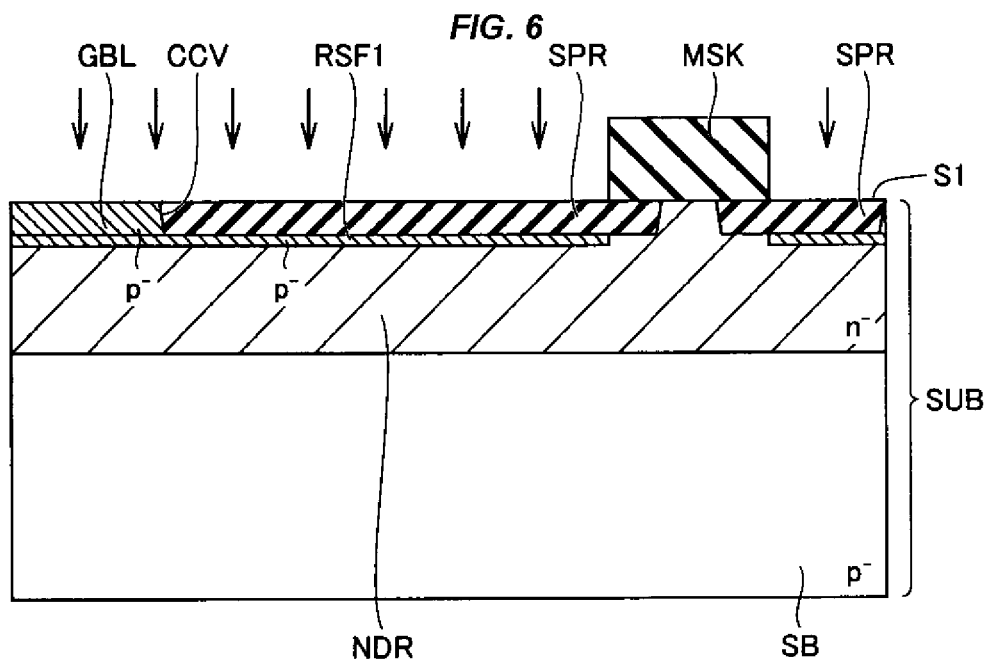
FIG. 6 is a schematic section view illustrating a third process of the method of manufacturing the semiconductor device according to the First Embodiment.

Next, referring to FIG. 6, by use of the normal photolithography technique and the etching technique, the mask pattern MSK including, for example, a silicon nitride film, is formed to have an opening in a region in which the p-type RESURF region RSF1 should be formed. Subsequently, by using the mask pattern MSK as a mask, p-type impurity ions are implanted by using the normal ion implantation technique, and thereby, the p-type RESURF region RSF1 and the p-type body region GBL are formed within the semiconductor substrate SUB. In FIG. 6, downward arrows mean implantation of impurity ions by the ion implantation technique. After the p-type RESURF region RSF1 or the like is formed, the mask pattern MSK is removed.

Here, as illustrated in FIGS. 2A and 2B described above, the p-type RESURF region RSF1 and the p-type body region GBL are formed simultaneously by the same ion implantation by using the same mask pattern MSK. In other words, the p-type RESURF region RSF1 and the p-type body region GBL are formed so that the peak of concentration appears mainly in the region on the left side in FIG. 6 with respect to the direction along the main surface 1 (region in which the p-type body region GBL should be formed) and so that the peak of concentration appears mainly in the region in which the p-type body region GBL should be formed also with respect to the depth direction vertical to the main surface S1 (see FIG. 2A). With this processing, the p-type RESURF region RSF1 is formed so as to extend in the transverse direction in FIG. 6 and so as to contact with the main surface S1 side of the n-type drift region NDR.

The boundary between the p-type RESURF region RSF1 and the p-type body region GBL formed so as to contact with the main surface S1 side thereof is located at the position of the bottom surface of the field oxide SPR, and the p-type RESURF region RSF1 is formed so as to have the region directly thereover in which the field oxide SPR is formed and the region directly thereover in which the p-type body region GBL is formed. Basically, the p-type RESURF region RSF1 directly under the field oxide SPR and the p-type RESURF region RSF1 directly under the p-type body region GBL have the same doping concentration if their depths are the same. However, the p-type RESURF region RSF1 directly under the field oxide SPR is formed by p-type impurity ions having passed through the field oxide SPR that serves as an obstacle at the time of ion implantation, and therefore, there is a case where the p-type doping concentration in the p-type RESURF region RSF1 directly under the field oxide SPR is lower than that in the p-type RESURF region RSF1 formed directly under the p-type body region GBL.

Figure 7:
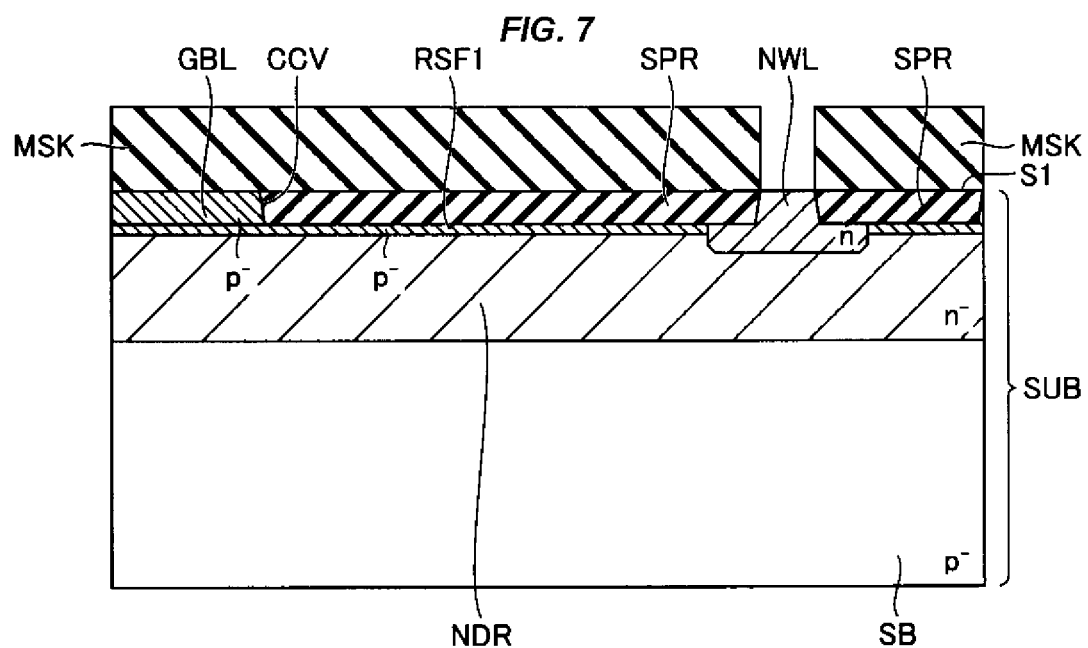
FIG. 7 is a schematic section view illustrating a fifth process of the method of manufacturing the semiconductor device according to the First Embodiment.

Referring to FIG. 7, by use of the normal photolithography technique, the mask pattern MSK having an opening in the region in which the n-type well region NWL should be formed is formed. Next, by use of the normal ion implantation technique, n-type impurity ions (e.g., phosphorus) are implanted, and thereby the n-type well region NWL is formed. After the n-type well region NWL is formed, the mask pattern MSK is removed. The n-type well region NWL is preferably formed by multi-stage ion implantation.

Figure 8:
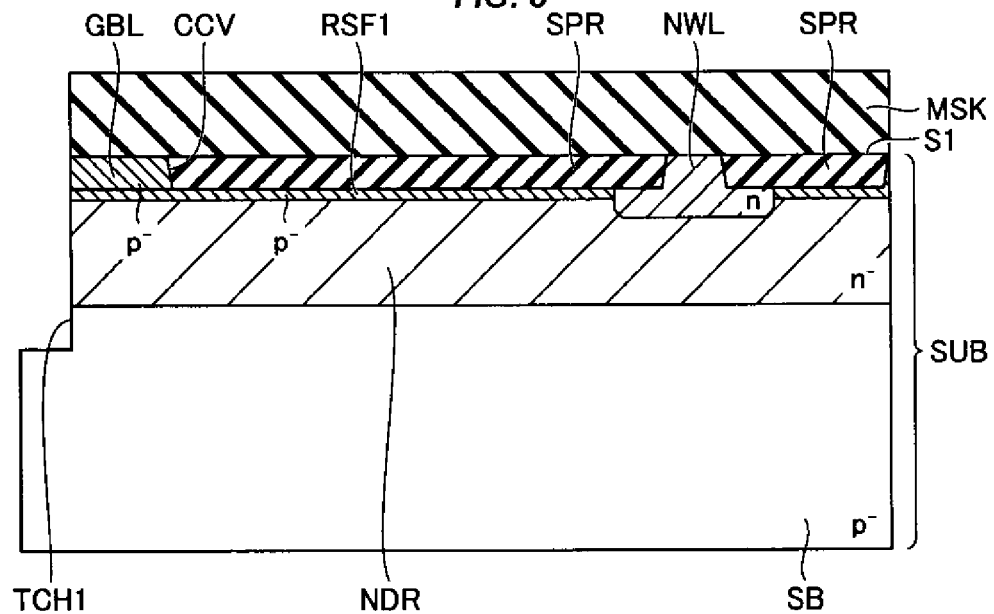
FIG. 8 is a schematic section view illustrating a sixth process of the method of manufacturing the semiconductor device according to the First Embodiment.

Referring to FIG. 8, next, by use of the normal photolithography technique and the etching technique, agate trench TCH1 is formed. Here, the gate trench TCH1 extending in the depth direction from the main surface S1 is formed so as to neighbor both the p-type body region GBL and the p-type RESURF region RSF1. The gate trench TCH1 is formed so as to at least reach the n-type drift region NDR, and in FIG. 8, the gate trench TCH1 is formed so as to penetrate through the n-type drift region NDR and to reach the substrate region SB thereunder.

Figure 9:
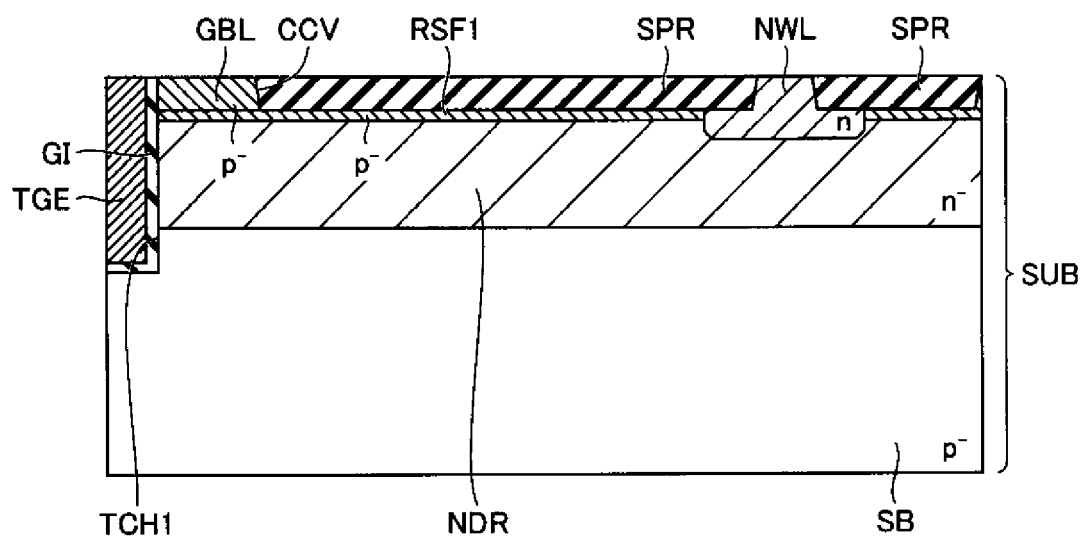
FIG. 9 is a schematic section view illustrating a seventh process of the method of manufacturing the semiconductor device according to the First Embodiment.

Referring to FIG. 9, next, by use of the thermal oxidation processing method or the like, a silicon oxide film is formed on the bottom sidewall of the gate trench TCH1. In this state, a polycrystalline silicon film (DOPOS: DOped POly Silicon) or the like containing, for example, conductive impurities, is formed by the normal CVD method so as to fill in the gate trench TCH1. After that, the silicon oxide film, the polycrystalline silicon film, and the like described above are etched back, and thereby, a gate insulating film GI and a trench gate electrode TGE in an aspect illustrated in FIG. 9 are formed. The trench gate electrode TGE is formed as a gate electrode of the LDMOS transistor.

Referring to FIG. 10, by using the normal photolithography technique and the ion implantation technique, directly over the p-type body region GBL on the main surface S1 of the semiconductor substrate SUB, a source region SR by implantation of n-type impurity ions and a p-type back gate region PBG by implantation of p-type impurity ions are formed. Similarly, directly over the n-type well region NWL on the main surface S1 of the semiconductor substrate SUB, a drain region DR by implantation of n-type impurity ions is formed.

Referring to FIG. 11, over the main surface S1 of the semiconductor substrate SUB, the interlayer insulating film II including a silicon oxide film is formed by using, for example, the CVD method, and after that, the interlayer insulating film II is ground by the CMP so that the top surface thereof is flattened. Further, by use of the normal photolithography technique and the etching technique, via holes are formed in the interlayer insulating film II so as to reach the trench gate electrode TGE, the source region SR, the p-type back gate region PBG, and the drain region DR, respectively. Inside the via hole, for example, a conductive film including tungsten is formed by, for example, the CVD method and a thin film of tungsten over the interlayer insulating film II is removed by the CMP.

Referring to FIG. 1, thereafter, over the interlayer insulating film II, for example, a thin film including aluminum is formed by, for example, sputtering. Then, by use of the normal photolithography technique and the etching technique, for example, the metal wiring AL including aluminum is formed. As such, the LDMOS transistor having the configuration illustrated in FIG. 1 is formed.

The metal wiring AL of aluminum is preferably formed so as to avoid the region that planarly overlaps the double RESURF region DRR between the source region SR and the drain region DR.

Figure 12:
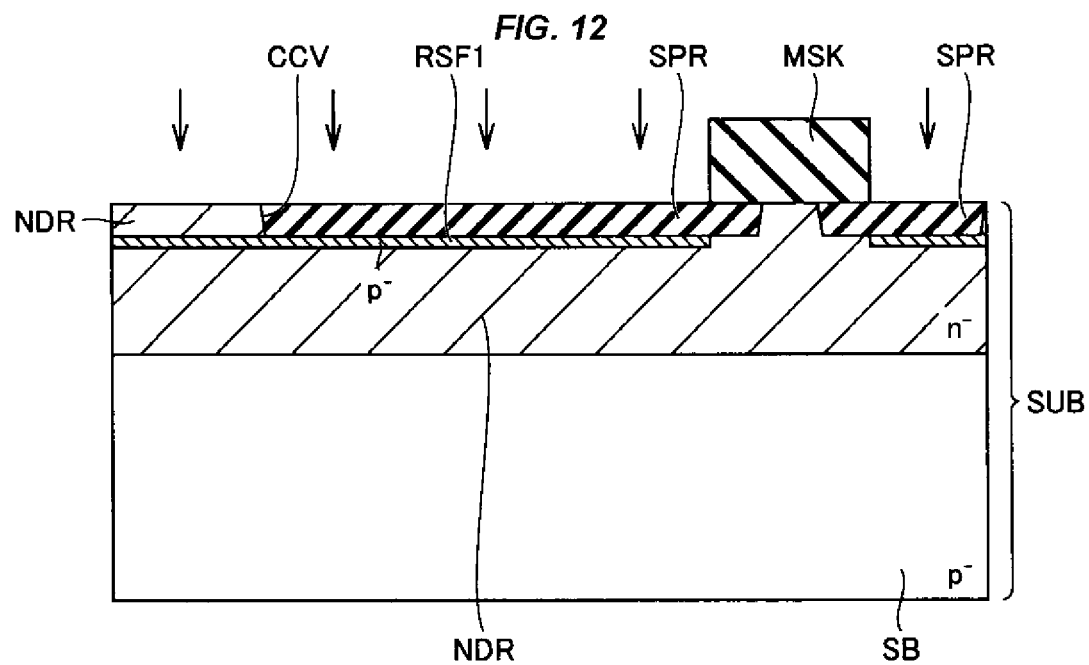
FIG. 12 is a schematic section view illustrating a first process in a modified example of the method of manufacturing the semiconductor device according to the First Embodiment.

In the manufacturing method as above, the p-type RESURF region RSF1 and the p-type body region GBL are formed by the same ion implantation, but they may be formed separately by different ion implantations. Referring to FIG. 12, in the state where the same mask pattern MSK as the mask pattern MSK illustrated in FIG. 6 is formed, p-type impurity ions are implanted so that the peak of concentration appears mainly in the position illustrated in FIG. 3A with respect to the depth direction, and thereby, the p-type RESURF region RSF1 is formed.

Figure 13:
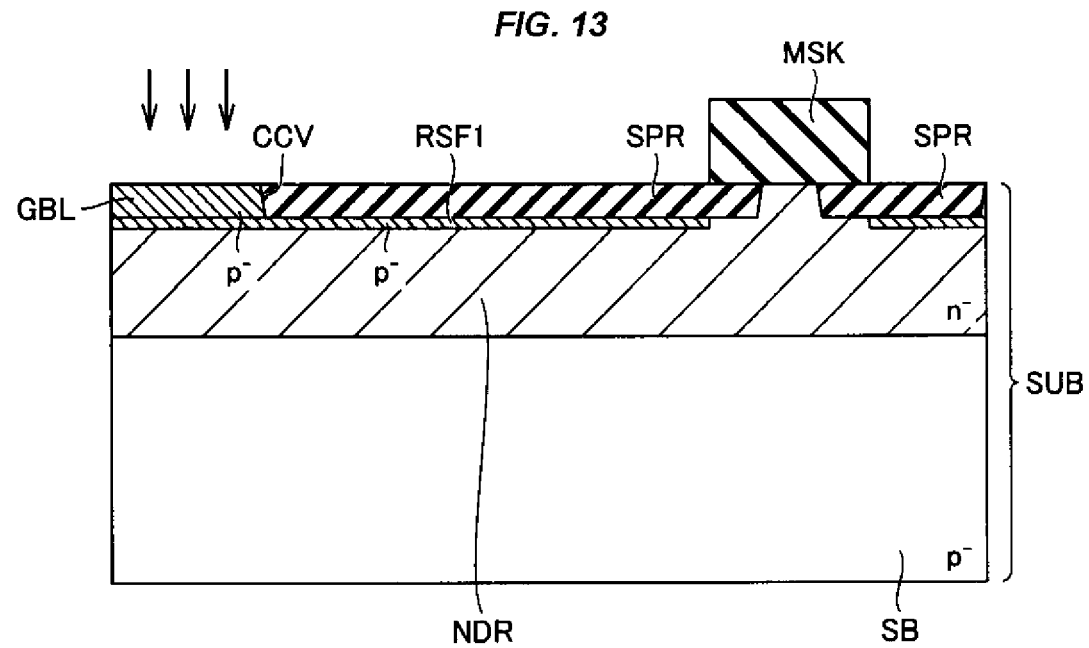
FIG. 13 is a schematic section view illustrating a second process in the modified example of the method of manufacturing the semiconductor device according to the First Embodiment.

Referring to FIG. 13, next, by using the same mask pattern MSK as the mask pattern MSK used in ion implantation of the above-described p-type RESURF region RSF1, p-type impurity ions are implanted so that the peak of concentration appears mainly in the position of the peak illustrated in FIG. 3A with respect to the depth direction, and thereby, the p-type body region GBL is formed. Afterward, the same processings as that in FIG. 7 to FIG. 11 and FIG. 1 are performed and the LDMOS transistor having the configuration illustrated in FIG. 1 is formed.

Figure 14:
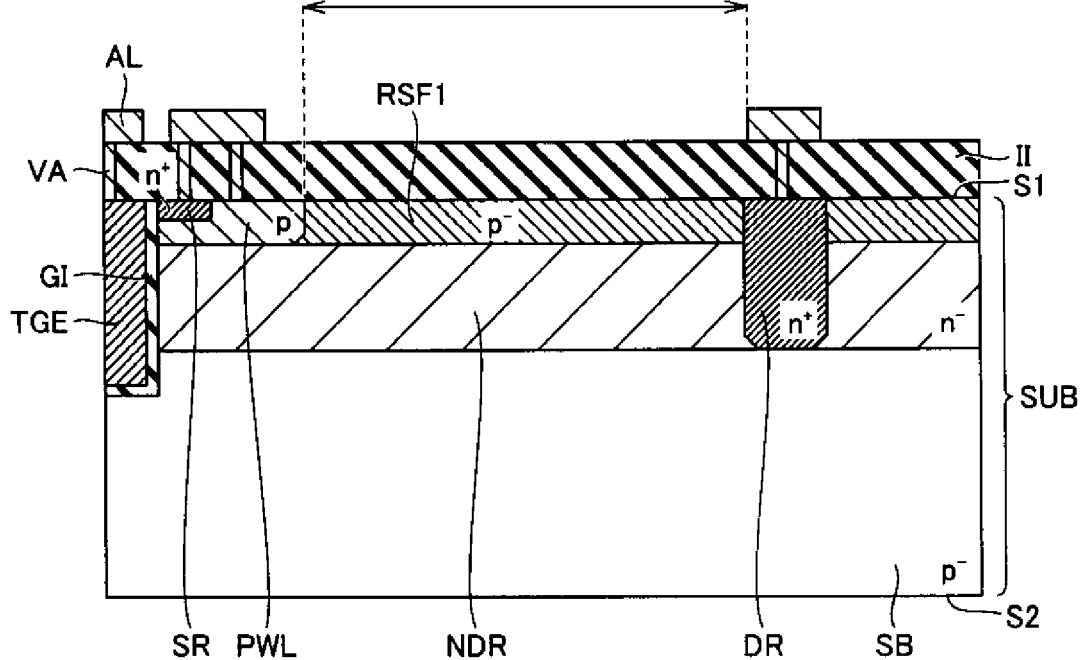
FIG. 14 is a section view schematically illustrating a configuration of a semiconductor device in a comparative example.

Next, with reference to a comparative example in FIG. 14, the working and effect of the present embodiment are explained. Referring to FIG. 14, firstly, in the LDMOS transistor in the comparative example, the p-type RESURF region RSF1 in contact with the top surface of the n-type drift region NDR and a p-type well region PWL that functions as the channel region in which the conductivity type is reversed by the electric field effect at the time of drive as in the p-type body region GBL are arranged so as to be located side by side (so as to neighbor each other) with respect to the direction along the main surface of the semiconductor substrate SUB as the same layer. In this case, the concentration profile in the p-type RESURF region RSF1 is quite different from that in the p-type well region PWL, and therefore, it is not possible to simultaneously form the p-type RESURF region RSF1 and the p-type well region PWL by using the same mask pattern and it is necessary to form them separately by using different mask patterns (by performing ion implantations twice). This causes reduction in the process efficiency and induces a possibility of rise in manufacturing cost. Because of being formed in different processes, there is no need for the field oxide SPR (through which impurity ions pass at the time of ion implantation) to be formed over the p-type RESURF region RSF1 in FIG. 14.

Meanwhile, in the present embodiment, the p-type body region GBL is formed so as to overlap the partial region of the p-type RESURF region RSF1 on the main surface S1 side and both are not formed to be located side by side in the direction along the main surface S1. Accordingly, a simultaneous formation using the same mask is capable, and therefore, it is possible to improve the process efficiency as well as to reduce the manufacturing cost.

Secondly, in FIG. 14, impurity ions configuring the p-type well region PWL diffuse in the main surface direction, and thereby, the p-type well region PWL advances toward the p-type RESURF region RSF1 adjacent thereto and there is a possibility that the dimension in the main surface direction of the double RESURF region DRR will be reduced.

Meanwhile, in the present embodiment, the p-type body region GBL is formed over the p-type RESURF region RSF1, and further, with respect to the main surface direction, the field oxide SPR is formed so as to neighbor the p-type body region GBL. Therefore, a trouble of changing the dimension of the p-type RESURF region RSF1 due to diffusion of the p-type body region GBL in the main surface direction is less likely to occur. Consequently, the dimension in the main surface direction of the double RESURF region DRR is determined by end parts of the field oxide SPR between the source region SR and the drain region DR, and such trouble that the dimension is reduced unexpectedly is suppressed.

Thirdly, in FIG. 14, the drain region DR has a high n-type doping concentration and is formed with its depth comparatively large (up to the lowest part of the n-type drift region NDR). Therefore, the electric field intensity between the drain region DR and the substrate region SB becomes high, and a depletion layer becomes unlikely to occur at the joined part of both and the breakdown voltage at the joined part of both regions is reduced. In other words, in the LDMOS transistor in FIG. 14, the breakdown voltage between the source region SR and the drain region DR that should originally be determined by the dimension in the main surface direction of the double RESURF region DRR is determined by the breakdown voltage at the lowest part of the drain region DR. In other words, in the configuration in FIG. 14, if the drain region DR is formed with its depth large, the upper limit of the drain breakdown voltage of the LDMOS transistor is not determined by the dimension in the direction along the main surface S1 of the double RESURF region DRR but rather determined by the breakdown voltage at the lowest part of the drain region DR (impurity region). Therefore, there is a possibility that the breakdown voltage of the transistor will be reduced regardless of the dimension of the double RESURF region DRR.

Meanwhile, in the present embodiment, the lowest part of the n-type well region NWL continuous with the drain region DR is formed shallower than the n-type drift region NDR, and therefore, the distance between the drain region DR and the n-type well region NWL, in which the n-type doping concentration is high, and the p-type substrate region SB becomes longer than that in FIG. 4. Because of this, the electric field intensity in the region between the n-type well region NWL and the substrate region SB becomes low and a depletion layer becomes more likely to occur at the joined part of both regions and the breakdown voltage at the joined part of both regions is increased. Further, it is possible to control the breakdown voltage between the source region SR and the drain region DR in accordance with the dimension in the main surface direction of the double RESURF region DRR as designed originally. Consequently, by ensuring the dimension in the main surface direction of the p-type RESURF region RSF1 as described above, it is possible to increase the breakdown voltage of the LDMOS transistor. Specifically, the breakdown voltage of the double RESURF region DRR is preferably not less than 15 V/μm.

(Second Embodiment)

Figure 15:
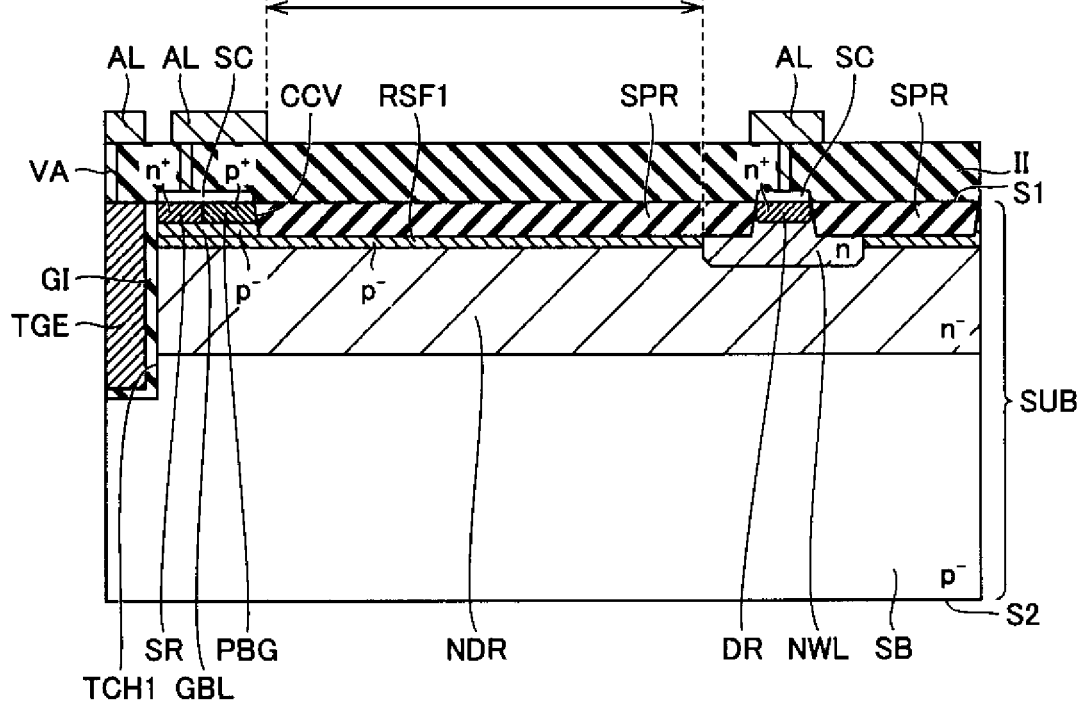
FIG. 15 is a section view schematically illustrating a configuration in a first example of a semiconductor device in a Second Embodiment.

Referring to FIG. 15, the LDMOS transistor in a first example of the present embodiment basically has the same configuration as that of the LDMOS transistor in FIG. 1 in the First Embodiment, but at the highest parts of the source region SR, the p-type back gate region PBG, and the drain region DR, a silicide layer SC is formed as a region in which silicon has reacted with a metal material. In particular, the source region SR and the p-type back gate region PBG neighbor each other so as to contact with each other with respect to the main surface direction, and the silicide layer SC is formed so as to stride over the top surfaces of both the regions SR and PBG. Then, a via VA is connected to the silicide layer SC so as to reach the top surface of the silicide layer SC over the regions SR and PBG. The via VA is shared by both the source region SR and the p-type back gate region PBG.

The configuration in FIG. 15 other than the above is substantially the same as the configuration in the First Embodiment, and therefore, the same symbols are attached to the same components and explanation thereof is not repeated (this also applied to each embodiment below).

With such configuration, one via VA is enabled to electrically couple with a plurality of conductive impurity regions, and therefore, the configuration of the whole device can be simplified.

Figure 16:
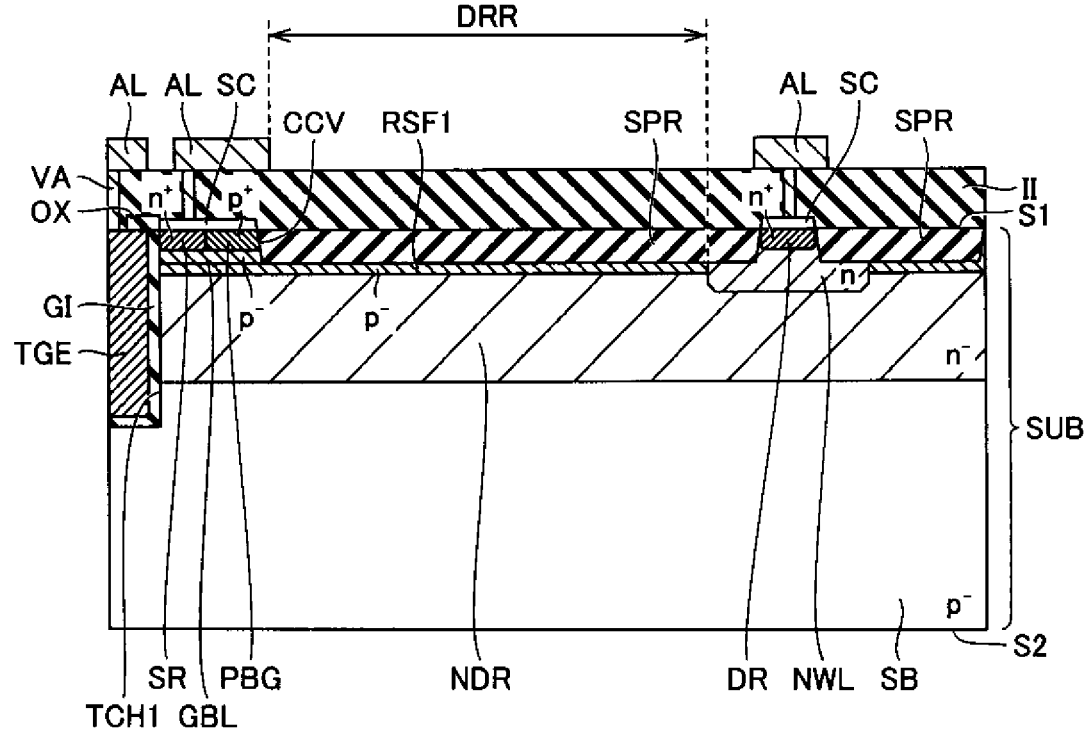
FIG. 16 is a section view schematically illustrating a configuration in a second example of the semiconductor device according to the Second Embodiment.

Referring to FIG. 16, the LDMOS transistor in a second example of the present embodiment has substantially the same configuration as that of the LDMOS transistor in the first example in FIG. 15, but differs from that in the first example in FIG. 15 in that a block insulating film OX is formed on the top surface of the edge part of the trench gate electrode TGE, in particular, on the source region SR side (on the right side in FIG. 16). With such configuration, it is possible to suppress a short circuit between the silicide layer SC over the source region SR and the p-type back gate region PBG, and the trench gate electrode TGE.

Figure 17:
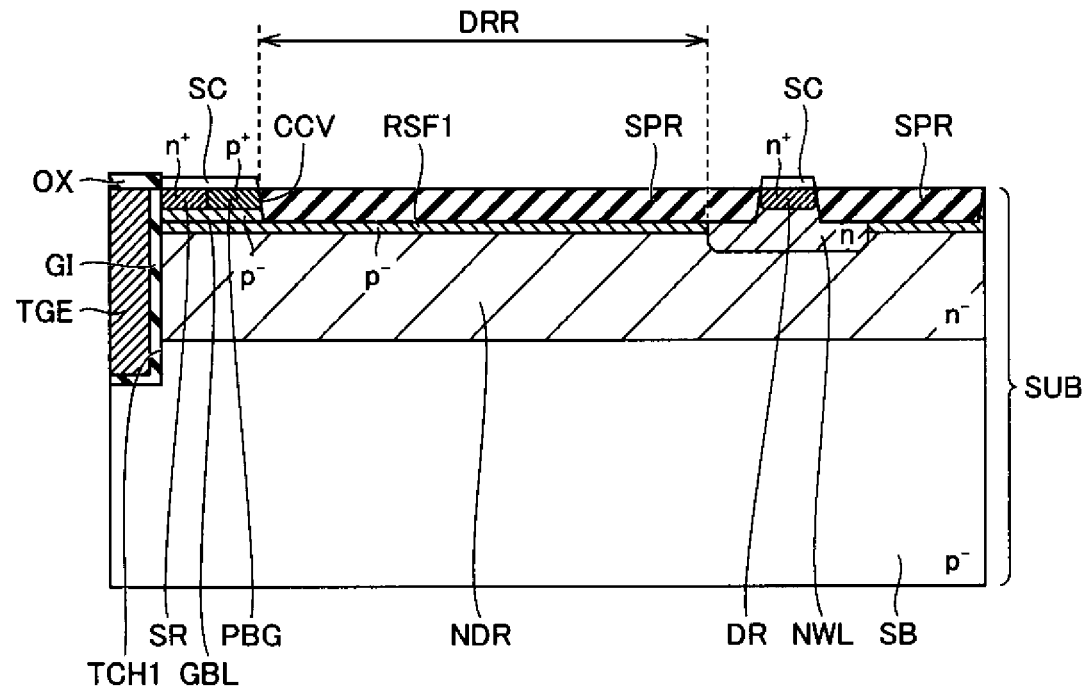
FIG. 17 is a schematic section view illustrating a first process of a method of manufacturing the semiconductor device according to the second example of the Second Embodiment.

Referring to FIG. 17, in the manufacturing method of the configuration in FIG. 16, the above-described block insulating film OX is formed by, for example, forming a mask pattern having an opening over the trench gate electrode TGE after forming the trench gate electrode TGE and the silicide layer SC, and forming a silicon oxide film by the thermal oxidation processing method or the like over the trench gate electrode TGE (in particular, the edge part on the source region SR side thereof) by using the mask pattern. The manufacturing method in the Second Embodiment other than the above is the same as the manufacturing method in the First Embodiment, and therefore, explanation thereof is not repeated (this also applies to each embodiment below).

(Third Embodiment)

Figure 18:
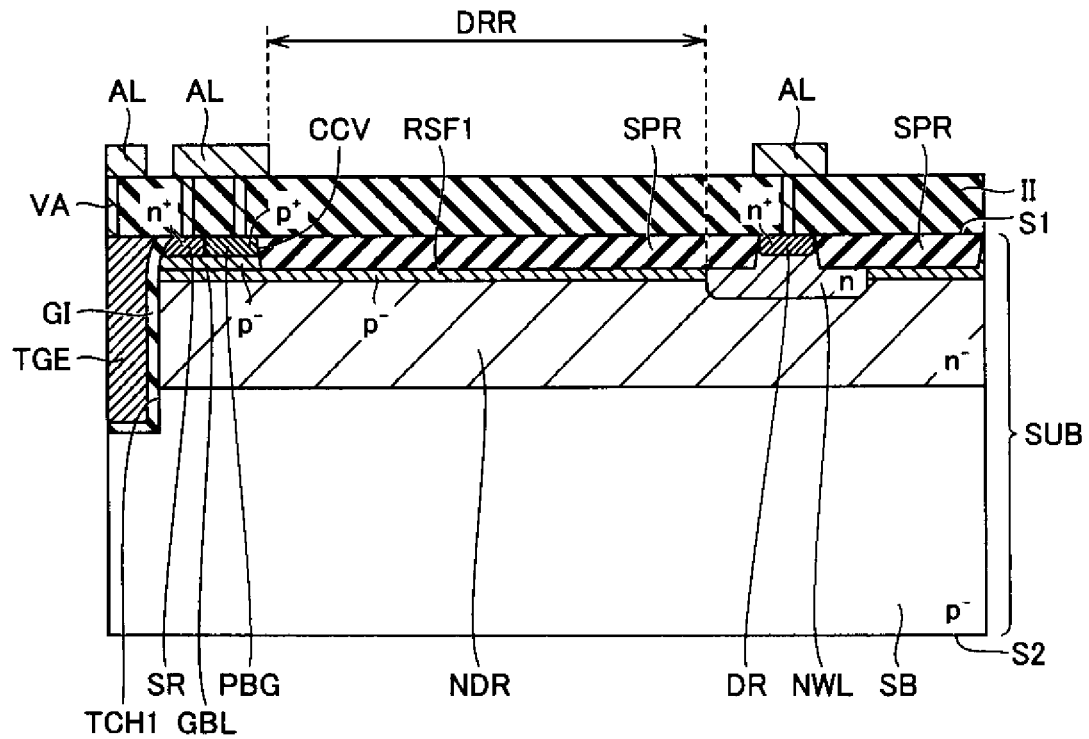
FIG. 18 is a section view schematically illustrating a configuration of a semiconductor device according to a Third Embodiment.

Referring to FIG. 18, the LDMOS transistor of the present embodiment basically has the configuration substantially the same as that of the LDMOS transistor in FIG. 1 in the First Embodiment, but the edge part of the gate trench TCH1 is rounded so that the width of the trench gate electrode TGE becomes larger toward a side of the one main surface S1, and thereby, the width of the gate trench TCH1 becomes larger toward a side of the one main surface S1. Here, the width means the dimension in the direction along the main surface.

Figure 19:
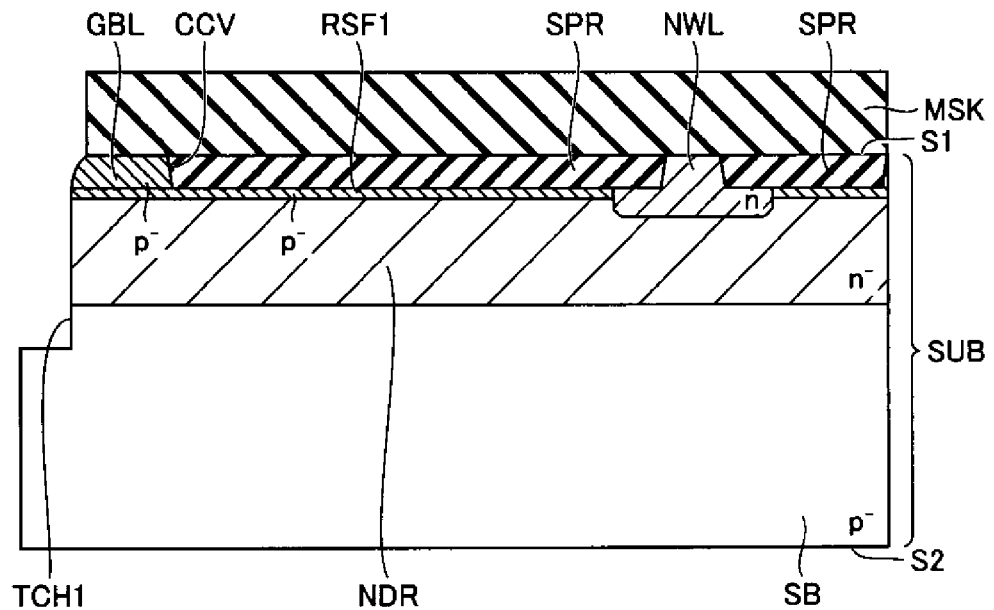
FIG. 19 is a schematic section view illustrating a first process of a method of manufacturing the semiconductor device according to the Third Embodiment.

Referring to FIG. 19, the gate trench TCH1 such as this is etched in, for example, the process for forming the gate trench TCH1 in FIG. 8, so that the shape of the gate trench TCH1 to be formed is made round at the edge part where the gate trench TCH1 intersects the main surface S1 and the width thereof becomes larger toward the main surface S1. The same processing as that described above by oxidation may be performed in place of etching.

With such configuration, a trouble that the formed trench gate electrode TGE causes concentration of the electric field at the edge part on the source region SR side is less likely to occur.

(Fourth Embodiment)

Figure 20:
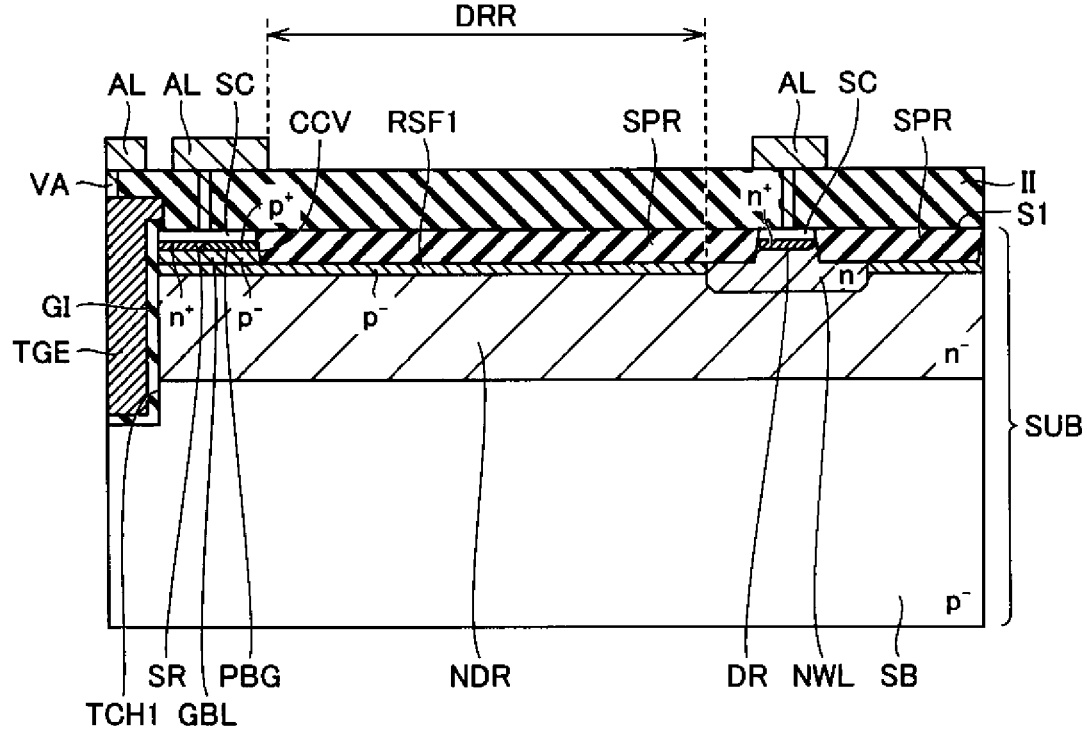
FIG. 20 is a section view schematically illustrating a configuration of a semiconductor device according to a Fourth Embodiment.

Referring to FIG. 20, in the present embodiment, the trench gate electrode TGE formed by DOPOS or the like with which the gate trench TCH1 is filled has a shape in which the trench gate electrode TGE partially rides on the upper side of the main surface S1 of the semiconductor substrate SUB from within the gate trench TCH1. Specifically, the trench gate electrode TGE extends continuously, for example, up to the portion directly over part of the source region SR and due to this, the portion of the trench gate electrode TGE located over the main surface S1 has a width larger than that of the portion of the trench gate electrode TGE located within the gate trench TCH1.

Figure 21:
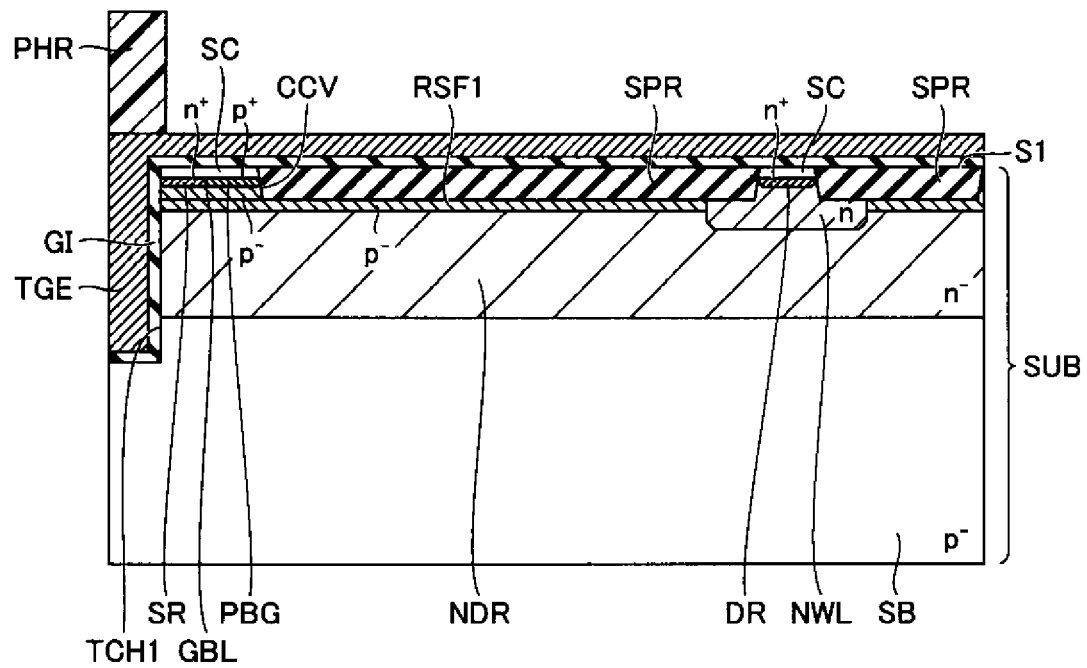
FIG. 21 is a schematic section view illustrating a first process of a method of manufacturing the semiconductor device according to the Fourth Embodiment.

Referring to FIG. 21, in the manufacturing method of the present embodiment, after the source region SR, the p-type back gate region PBG, and the drain region DR are formed (and after the silicide layer SC is formed directly thereover), the gate trench TCH1 is formed, and the insulating film GI is formed by the thermal oxidation processing method so as to extend continuously up to the portion over the main surface S1 of the semiconductor substrate SUB from the inner sidewall of the gate trench TCH1, and a DOPOS film or the like is formed over the insulating film GI so as to fill in the gate trench TCH1.

After that, directly over the gate trench TCH1, a photoresist pattern PHR (resist pattern) covering a part of the region within and outside the gate trench TCH1 is formed so as to have a width larger than the width of the gate trench TCH1 and so that the end part thereof exists, for example, directly over a part of the region of the source region SR.

Figure 22:
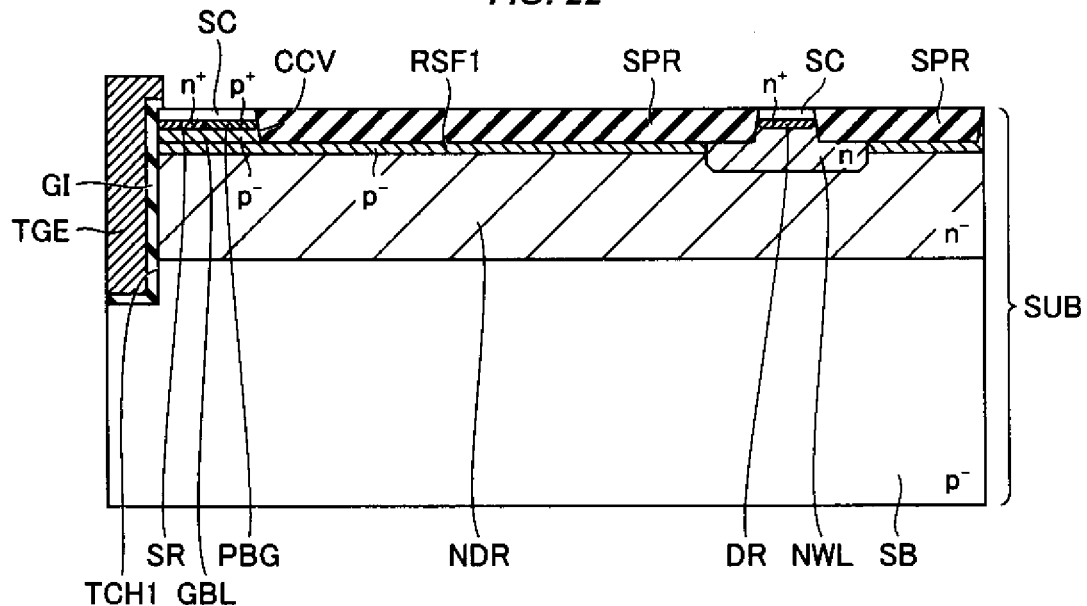
FIG. 22 is a schematic section view illustrating a second process of the method of manufacturing the semiconductor device according to the Fourth Embodiment.

Referring to FIG. 22, by using the resist pattern PHR having a wide opening in FIG. 21, the DOPOS film and the insulating film GI in the region not covered with the photoresist pattern PHR are removed and the gate insulating film GI and the trench gate electrode TGE are formed so as to ride on part of the region such as the source region SR on the periphery thereof from within the gate trench TCH1.

In the present embodiment, it is possible to make the area in a planar view of the trench gate electrode TGE larger than that of the gate trench TCH1. Because of this, in the subsequent processes, when forming the via VA that reaches the trench gate electrode TGE, it is possible to extend a margin of the position where the via VA is formed, and therefore, even if accuracy of position adjustment is low, it is possible to reliably form the via VA that can reach the trench gate electrode TGE.

(Fifth Embodiment)

Figure 23:
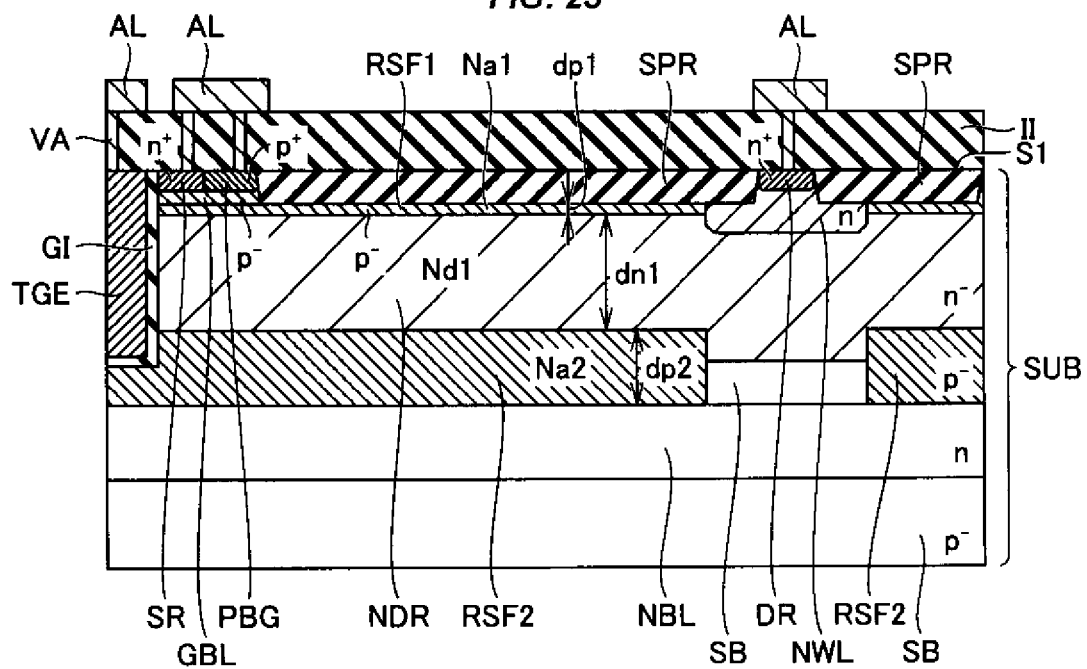
FIG. 23 is a section view schematically illustrating a configuration of a semiconductor device according to a Fifth Embodiment.

Referring to FIG. 23, the LDMOS transistor of the present embodiment basically has the configuration substantially the same as that of the LDMOS transistor in FIG. 1 in the First Embodiment, but differs in that a lower RESURF region in contact with the main surface S2 side (lower side) of the n-type drift region NDR is a p-type RESURF region RSF2 (second buried region) from that in the First Embodiment in which the substrate region SB of the semiconductor substrate SUB is regarded as the lower RESURF region.

The p-type RESURF region RSF2 is a p-type impurity region formed so as to be buried within the semiconductor substrate SUB and extends in the direction along the main surface of the semiconductor substrate SUB. The n-type drift region NDR forms the double RESURF region DRR by being sandwiched by the p-type RESURF region RSF1 that comes into contact with the top surface thereof and the p-type RESURF region RSF2 that comes into contact with the undersurface thereof. However, the p-type RESURF region RSF2 is formed so as to avoid the region directly under the n-type well region NWL (and the drain region DR).

The p-type doping concentration in the p-type RESURF region RSF2 is preferably higher than that in the substrate region SB. Specifically, in the present embodiment, if the n-type doping concentration in the n-type drift region NDR is taken to be Nd (cm$^{-3}$) and the depth of the n-type drift region NDR is taken to be dn (cm), the relationship $4 \times 10^{12} \leq Nd \times dn \leq 8 \times 10^{12}$ holds.

Further, if the p-type doping concentration in the p-type RESURF region RSF1 is taken to be Na1 (cm$^{-3}$) and the depth of the p-type RESURF region RSF1 is taken to be dp1 (cm), the relationship $2 \times 10^{12} \leq Na1 \times dp1 \leq 4 \times 10^{12}$ holds.

Furthermore, if the p-type doping concentration in the p-type RESURF region RSF2 is taken to be Na2 (cm$^{-3}$) and the depth of the p-type RESURF region RSF2 is taken to be dp2 (cm), the relationship $2 \times 10^{12} \leq Na2 \times dp2 \leq 4 \times 10^{12}$ holds. This is a preferred condition when setting the breakdown voltage of the double RESURF region DRR to an appropriate value.

An n-type buried region NBL (third buried region) is formed so as to contact with the lower side (main surface S2 side) of the p-type RESURF region RSF2. The n-type buried region NBL is an n-type impurity region formed so as to be buried within the semiconductor substrate SUB and extends in the direction along the main surface of the semiconductor substrate SUB. Preferably, the n-type doping concentration in the n-type buried region NBL (n region) is higher than that in the n-type drift region NDR (n⁻ region).

In the present embodiment, the trench gate electrode TGE (in particular, the gate trench TCH1) penetrates through the p-type RESURF region RSF1 and the n-type drift region NDR from the main surface S1 on the upper side of the semiconductor substrate SUB and extends in the direction intersecting (e.g., perpendicular to) the main surface of the semiconductor substrate SUB so as to reach the p-type RESURF region RSF2.

Next, by using FIGS. 24 to 31, a method of manufacturing the semiconductor device in the present embodiment illustrated in FIG. 23 is explained.

Figure 24:
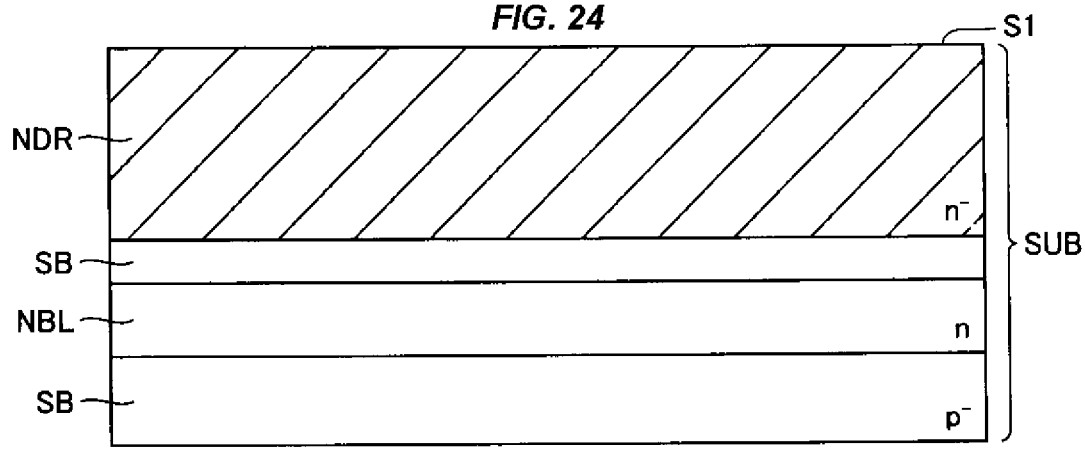
FIG. 24 is a schematic section view illustrating a first process of a method of manufacturing the semiconductor device according to the Fifth Embodiment.

Referring to FIG. 24, in the present embodiment, the n-type buried region NBL is formed over the p-type substrate region SB, and further, the semiconductor substrate SUB in which the p-type substrate region SB is formed by the epitaxial growth is used. From the main surface S1 side of the semiconductor substrate SUB, by using the normal ion implantation technique, the n-type drift region NDR is formed within the semiconductor substrate SUB. Preferably, the n-type buried region NBL is formed so that the peak of concentration appears mainly in the region deeper from the main surface S1 than the n-type drift region NDR and so that there is an interval from the n-type drift region NDR (with respect to the direction intersecting the main surface of the semiconductor substrate SUB) after the diffusion of impurity ions by thermal processing.

Figure 25:
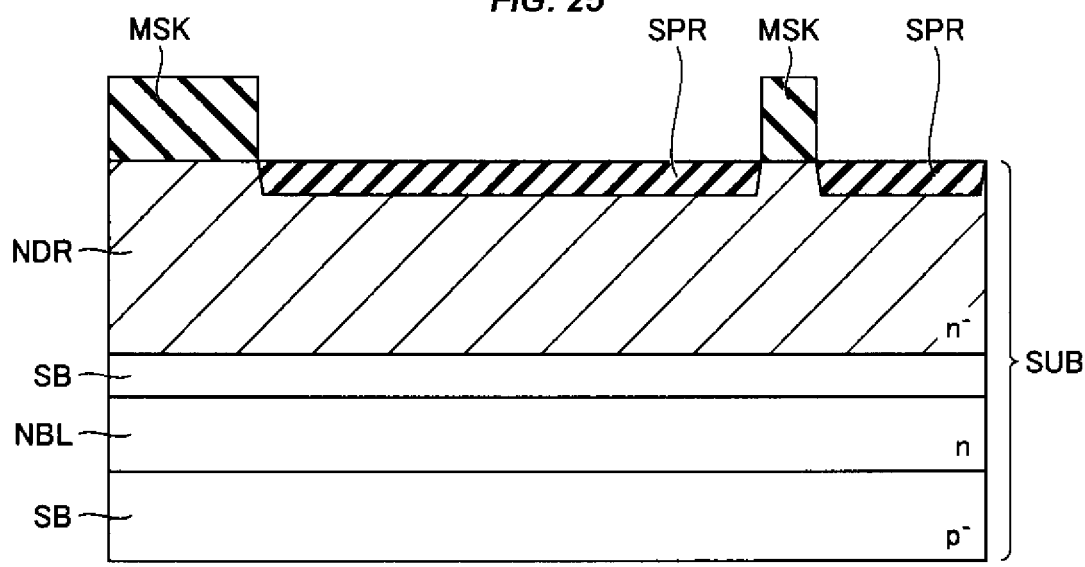
FIG. 25 is a schematic section view illustrating a second process of the method of manufacturing the semiconductor device according to the Fifth Embodiment.

Referring to FIG. 25, for the semiconductor substrate SUB in which the n-type drift region NDR and the n-type buried region NBL are formed, the mask pattern MSK is formed in the same process as that in FIG. 5 and by using this as a mask, the field oxide SPR is formed. After the field oxide SPR is formed, the mask pattern MSK is removed.

Figure 26:
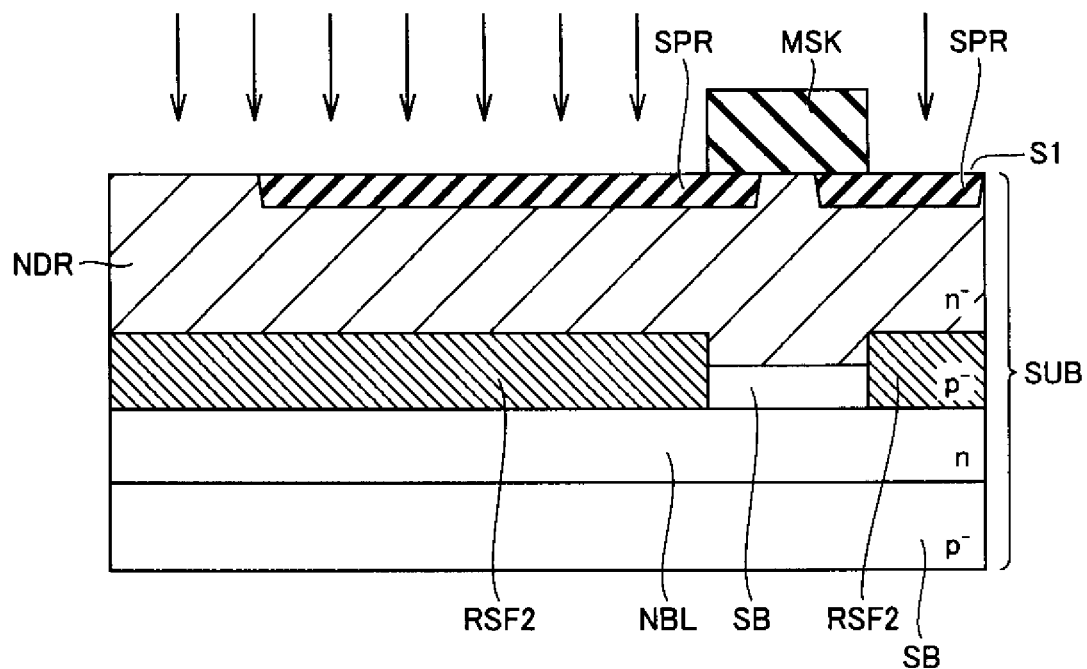
FIG. 26 is a schematic section view illustrating a third process of the method of manufacturing the semiconductor device according to the Fifth Embodiment.

By referring to FIG. 26, first, by using the normal photolithography technique, the mask pattern MSK is formed over the main surface S1 of the semiconductor substrate SUB. The mask pattern MSK is formed in the region that overlaps in a planar view the region in which the n-type well region NWL should be formed. Subsequently, by using the mask pattern MSK as a mask, p-type impurity ions are implanted by using the normal ion implantation technique, and thereby, the p-type RESURF region RSF2 is formed under the main surface, in particular, on the lower side of the n-type drift region NDR of the semiconductor substrate SUB.

At this time, by the mask pattern MSK, the p-type RESURF region RSF2 is formed so that the region directly under the region in which the n-type well region NWL should be formed (region that planarly overlaps the n-type well region NWL) has a region in which the p-type RESURF region RSF2 is not formed (cutout part of the p-type RESURF region RSF2).

Further, at this time, the p-type RESURF region RSF2 may be formed so as to overlap the region on the comparatively lower side of the n-type drift region NDR. In this case, for example, the n-type drift region NDR is arranged in part of the cutout part of the p-type RESURF region RSF2 (region on the comparatively upper side within the cutout part) and the substrate region SB in which nothing is formed for the semiconductor substrate SUB is arranged in the other part (region on the comparatively lower side within the cutout part).

Further, the p-type RESURF region RSF2 is preferably formed so that the n-type buried region NBL comes into contact with the main surface side on the low side thereof (in other words, so that the p-type RESURF region RSF2 comes into contact with the main surface side on the upper side of the n-type buried region NBL). The n-type buried region NBL may be formed along the whole main surface of the semiconductor substrate SUB including also the portion directly under the region in which the p-type RESURF region RSF2 is not formed after, for example, once removing the mask pattern MSK in FIG. 26.

Figure 27:
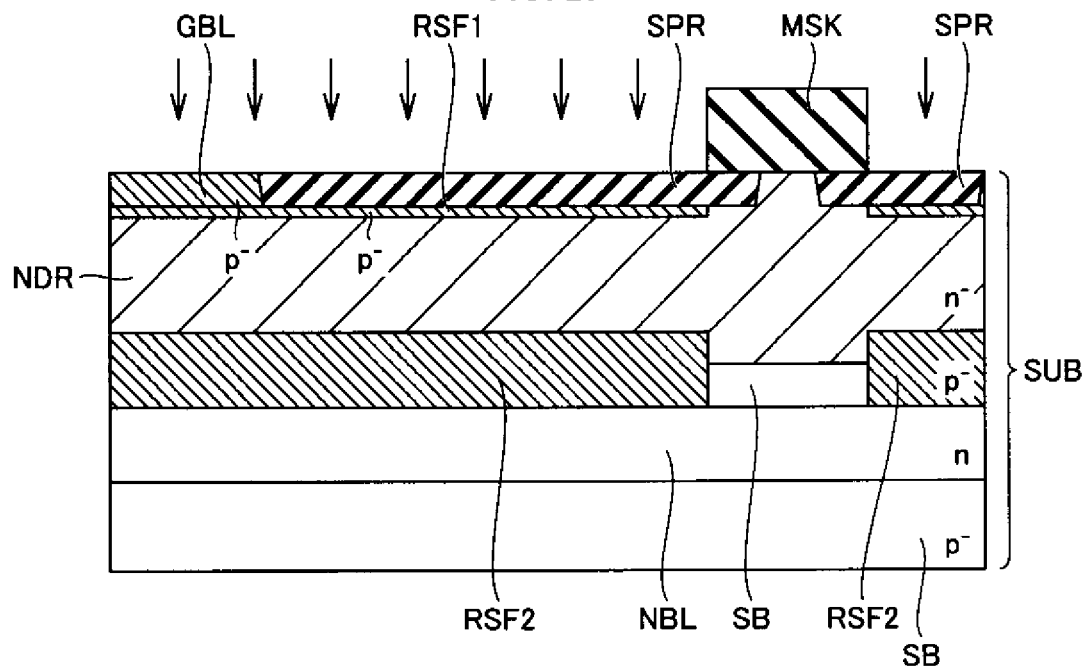
FIG. 27 is a schematic section view illustrating a fourth process of the method of manufacturing the semiconductor device according to the Fifth Embodiment.

Referring to FIG. 27, p-type impurity ions are implanted by using the normal ion implantation technique as, for example, in the process in FIG. 6. At this time, the same mask pattern MSK as the mask pattern MSK in FIG. 26 may be used. Accordingly, the p-type RESURF region RSF1 and the p-type body region GBL are formed within the semiconductor substrate SUB. The p-type RESURF region RSF1 and the p-type body region GBL may be formed simultaneously by the same ion implantation by using the same mask pattern MSK as that in FIG. 26 as in the process in FIG. 6, or the p-type RESURF region RSF1 and the p-type body region GBL may be formed separately by different ion implantations by using the same mask pattern MSK as that in FIG. 26 as in the processes in FIG. 12 and FIG. 13.

The order of the process for forming the p-type RESURF region RSF2 illustrated in FIG. 26 and the process for forming the p-type RESURF region RSF1 and the p-type body region GBL is not fixed. After the p-type RESURF region RSF1 and the like are formed, the mask pattern MSK is removed.

At this time, the p-type RESURF region RSF1 is formed so as to have a cutout part in the region that planarly overlaps the region in which the n-type well region NWL should be formed as in the case of the p-type RESURF region RSF2.

Figure 28:
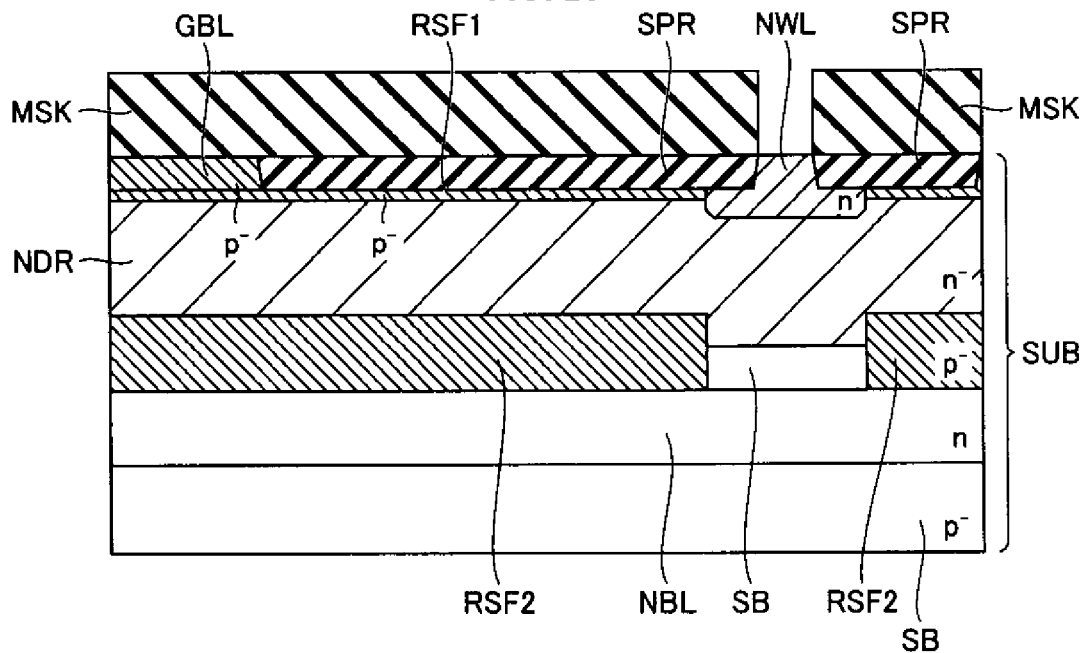
FIG. 28 is a schematic section view illustrating a fifth process of the method of manufacturing the semiconductor device according to the Fifth Embodiment.
Figure 29:
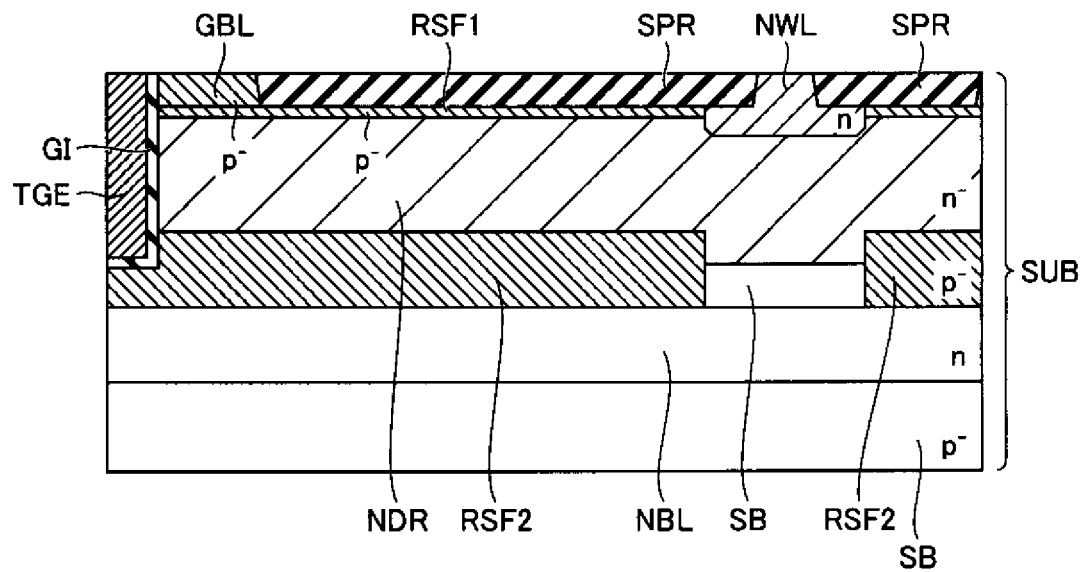
FIG. 29 is a schematic section view illustrating a sixth process of the method of manufacturing the semiconductor device according to the Fifth Embodiment.
Figure 30:
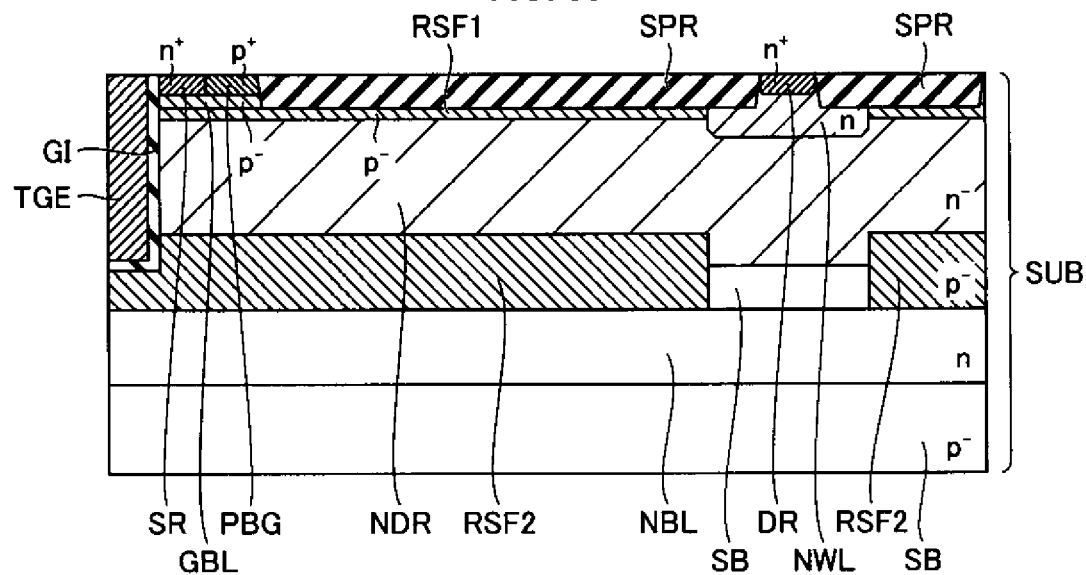
FIG. 30 is a schematic section view illustrating a seventh process of the method of manufacturing the semiconductor device according to the Fifth Embodiment.
Figure 31:
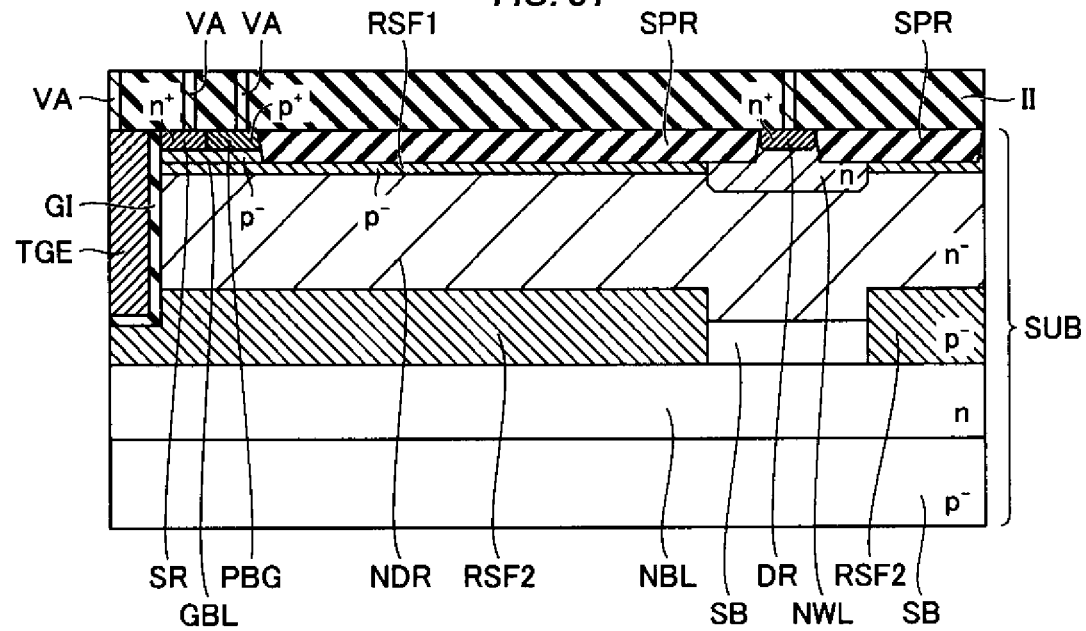
FIG. 31 is a schematic section view illustrating an eighth process of the method of manufacturing the semiconductor device according to the Fifth Embodiment.

Referring to FIG. 28, next, as in the process in FIG. 7, the n-type well region NWL is formed by multistage ion implantation. Referring to FIG. 29, the same processing as that in FIG. 8 and FIG. 9 is performed and referring to FIG. 30 and FIG. 31, the same processing as that in FIG. 10 and FIG. 11 is performed. The subsequent processing is also basically the same as the processing performed (to achieve the aspect in FIG. 1) in the process in FIG. 11 in the First Embodiment and in the subsequent processes. As such, the LDMOS transistor with the configuration illustrated in FIG. 23 is formed.

Next, the working and effect of the present embodiment are explained. In the present embodiment, the lower RESURF region is the p-type RESURF region RSF2 as the region to be buried within the semiconductor substrate SUB and the trench gate electrode TGE is formed so as to reach the inside of the p-type RESURF region RSF2. Because of this, the trench gate electrode TGE and the p-type RESURF region RSF2 are electrically capacity-coupled to each other by the gate insulating film GI being interposed therebetween. In other words, the potentials of the trench gate electrode TGE and the p-type RESURF region RSF2 have values close to each other, and for example, when the potential of the trench gate electrode TGE is 0 V, the potential of the region of the p-type RESURF region RSF2, in particular, of the region close to the trench gate electrode TGE is fixed to 0 V. Accordingly, the p-type RESURF region RSF2 is enabled to have the function as the double RESURF region DRR by controlling the potential of the p-type RESURF region RSF2 without the need to fix the potential of the p-type RESURF region RSF2 from outside the LDMOS transistor, and as a result, a high breakdown voltage between the source region SR and the drain region DR can be implemented.

Further, the n-type buried region NBL is formed so as to contact with the main surface side on the lower side of the p-type RESURF region RSF2 and the pn junction is formed therebetween, and thereby, for example, it is made possible to electrically separate the LDMOS transistor from the (p-type) substrate region SB on the lower side of the semiconductor substrate SUB, and therefore, it is possible to apply the LDMOS transistor to the so-called high side.

Furthermore, in the present embodiment, the p-type RESURF region RSF2 is formed so as to avoid the region directly under the n-type well region NWL (so as to have the cutout part of the p-type RESURF region RSF2). If the p-type doping concentration in the p-type RESURF region RSF2 is high compared to that in the substrate region SB, the p-type doping concentration becomes lower in the region directly under the n-type well region NWL (compared to the case where the p-type RESURF region RSF2 exits). Then, the electric field between the region and the n-type well region NWL directly thereover becomes weaker, and therefore, the voltage in the region becomes lower and the potential difference between the n-type well region NWL and the n-type buried region NBL directly thereunder becomes smaller. Because of this, the depletion layer becomes likely to extend between both the regions (in the substrate region SB between both the regions), and therefore, it is possible to make an attempt to further increase the breakdown voltage between the n-type well region NWL and the n-type buried region NBL directly thereunder.

(Sixth Embodiment)

Figure 32:
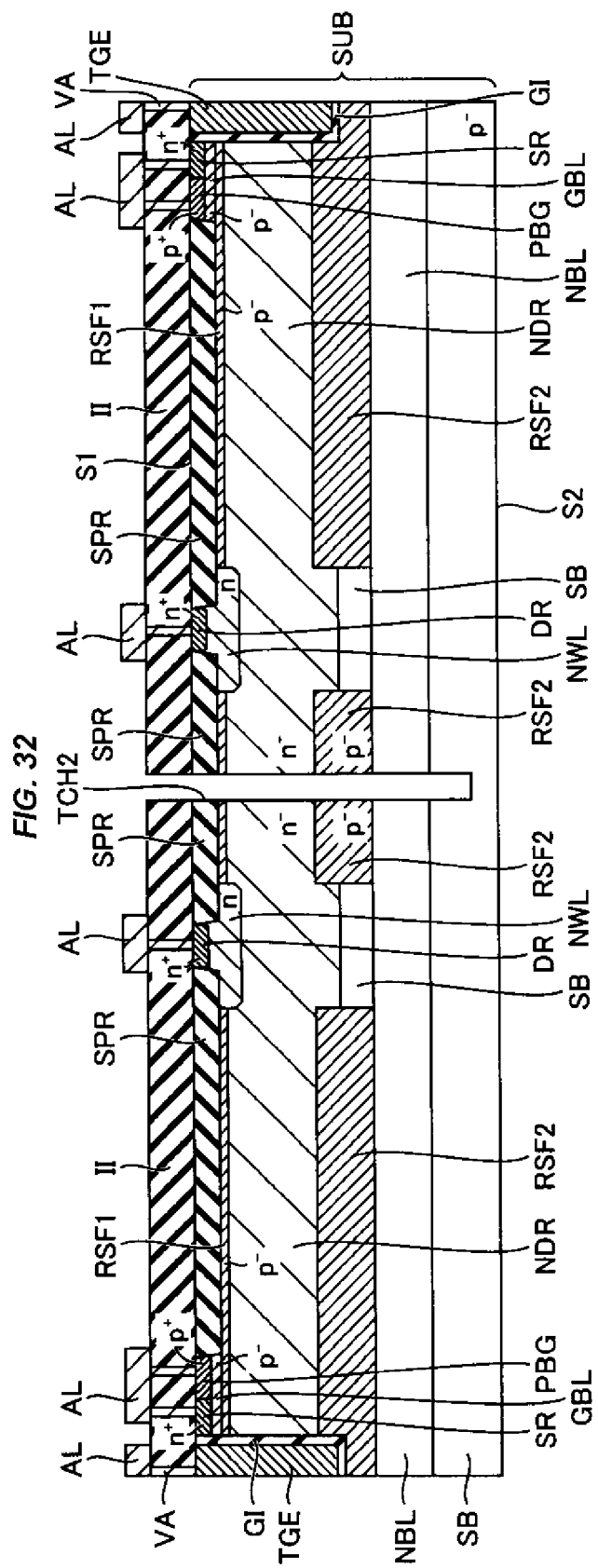
FIG. 32 is a section view schematically illustrating a configuration of a semiconductor device according to a Sixth Embodiment.

Referring to FIG. 32, in the present embodiment, a plurality of (e.g., two) configurations basically the same as that of the LDMOS transistor in FIG. 23 in the Fifth Embodiment is located side by side with an interval in between in the direction along the main surface within the semiconductor substrate SUB. Then, between these configurations, an element isolation trench TCH2 is formed as a groove part extending in the direction intersecting (e.g., perpendicular to) the main surface so as to penetrate through the n-type buried region NBL from the main surface S1 of the semiconductor substrate SUB. The element isolation trench TCH2 is formed by, for example, the normal photolithography technique and the dry etching technique. The element isolation trench TCH2 may be used in each of the above-described embodiments (e.g., First Embodiment).

With such configuration, the potential of each of the p-type RESURF regions RSF2 is fixed by the trench gate electrode TGE for each of a plurality of LDMOS transistors. Further, each of a plurality of n-type buried regions NBL enters the floating state where the potential thereof is not fixed individually from outside. In this state, if the drain voltage is applied to the n-type drift region NDR, normally, the substrate region SB is fixed to 0 V, and therefore, the potential of the n-type buried region NBL arranged between the n-type drift region NDR and the substrate region SB directly thereunder will be an intermediate potential between the potential of the n-type drift region NDR and that of the substrate region SB. Because of this, the potential difference between the n-type drift region NDR and the n-type buried region NBL becomes smaller than the potential difference between the n-type drift region NDR and the substrate region SB. Consequently, it is possible to increase the breakdown voltage between the n-type drift region NDR and the n-type buried region NBL higher than the breakdown voltage between the drift region NDR and the substrate region SB in the case where, for example, the n-type buried region NBL does not exist. Because of this, it is possible to further increase the breakdown voltage of the whole LDMOS transistor.

(Seventh Embodiment)

Figure 33:
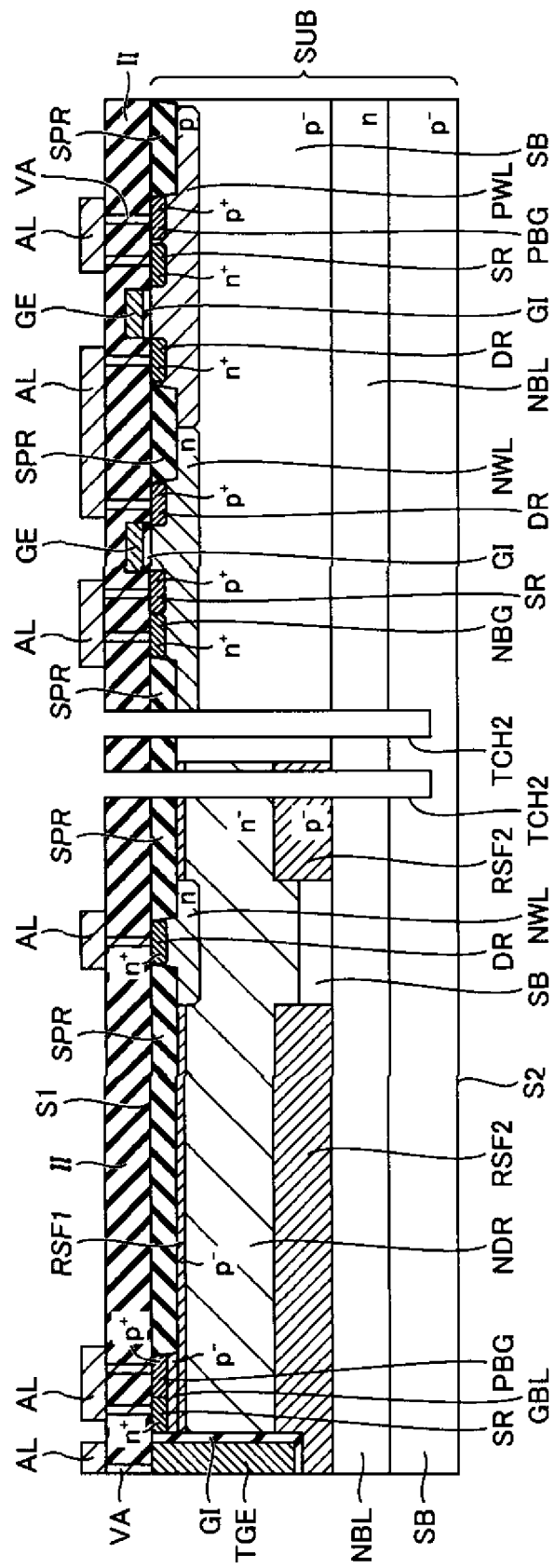
FIG. 33 is a section view schematically illustrating a configuration of a semiconductor device according to a Seventh Embodiment.

Referring to FIG. 33, in the present embodiment, on the left side of the element isolation trench TCH2, the same LDMOS transistor as that in FIG. 32 and that in FIG. 23 in the Fifth Embodiment is arranged. However, on the right side of the element isolation trench TCH2 in FIG. 33, two normal MOS transistors that operate under a voltage condition lower than that of the LDMOS transistor are arranged with an interval in between with respect to the direction along the main surface of the semiconductor substrate SUB. These MOS transistors (other transistors) are arranged so as to be located side by side with the LDMOS transistors with a pair of the element isolation trenches TCH2 being sandwiched in between and one of the two MOS transistors (e.g., the MOS transistor on the left side in FIG. 33) is a so-called p-channel type transistor and the other (e.g., the MOS transistor on the right side in FIG. 33) is a so-called n-channel type transistor.

In FIG. 33, the two element isolation trenches TCH2 are formed. Of the two, the element isolation trench TCH2 on the left side in FIG. 33 is formed in order to terminate the formation region of the LDMOS transistor and the element isolation trench TCH2 on the right side in FIG. 33 is formed in order to terminate the formation region of the low voltage MOS transistor.

The region in which the low voltage MOS transistor is formed is formed in the same semiconductor substrate SUB (having the substrate region SB) as the semiconductor substrate SUB in which the LDMOS transistor is formed. Then, as the same layer as the n-type buried region NBL in the region in which the LDMOS transistor is formed, also in the region in which the low voltage MOS transistor is formed, the n-type buried region NBL is formed.

As described above, the low voltage MOS transistor is electrically separated from the substrate region SB on the main surface S2 side in FIG. 33 by the n-type buried region NBL, and is also electrically separated from the LDMOS transistor by the element isolation trench TCH2. Because of this, it is possible to take a circuit configuration with a potential reference other than that of the substrate region SB.

In the region in which the low voltage MOS transistor is formed, on the main surface S1 of the semiconductor substrate SUB, the n-type well region NWL and the p-type well region PWL are formed so as to be located side by side with respect to the direction along the main surface S1. On the main surface S1 of the semiconductor substrate SUB, a plurality of field oxides SPR is formed with intervals in between in such a manner as to stride over the boundary between the n-type well region NWL and the p-type well region PWL. By the field oxide SPR, the two low voltage MOS transistors are formed on the main surface S1 of the semiconductor substrate SUB so as to be electrically insulated from each other.

One of the low voltage MOS transistors (p-channel type transistor) is formed in the n-type well region NWL. The p-channel type transistor has a p-type pair of source/drain regions SR/DR, an n-type back gate region NBG, the gate insulating film GI, and a gate electrode GE. The n-channel type transistor has an n-type pair of the source/drain regions SR/DR, the p-type back gate region PBG, the gate insulating film GI, and the gate electrode GE.

Both in the p-channel type transistor and in the n-channel type transistor, each of the pairs of the source/drain regions SR/DR is formed on the surface of the semiconductor substrate SUB with a distance in between. The gate insulating film GI is formed over the surface of the semiconductor substrate SUB sandwiched by the pair of the source/drain regions SR/DR. The gate electrode GE is formed over the gate insulating film. GI. Each of the drain regions DR is coupled to the common metal wiring AL via the via VA. Further, in each of the transistors, the source region SR and the back gate regions NBG and PBG are coupled to the common metal wiring AL via the via VA.

(Eighth Embodiment)

Figure 34:
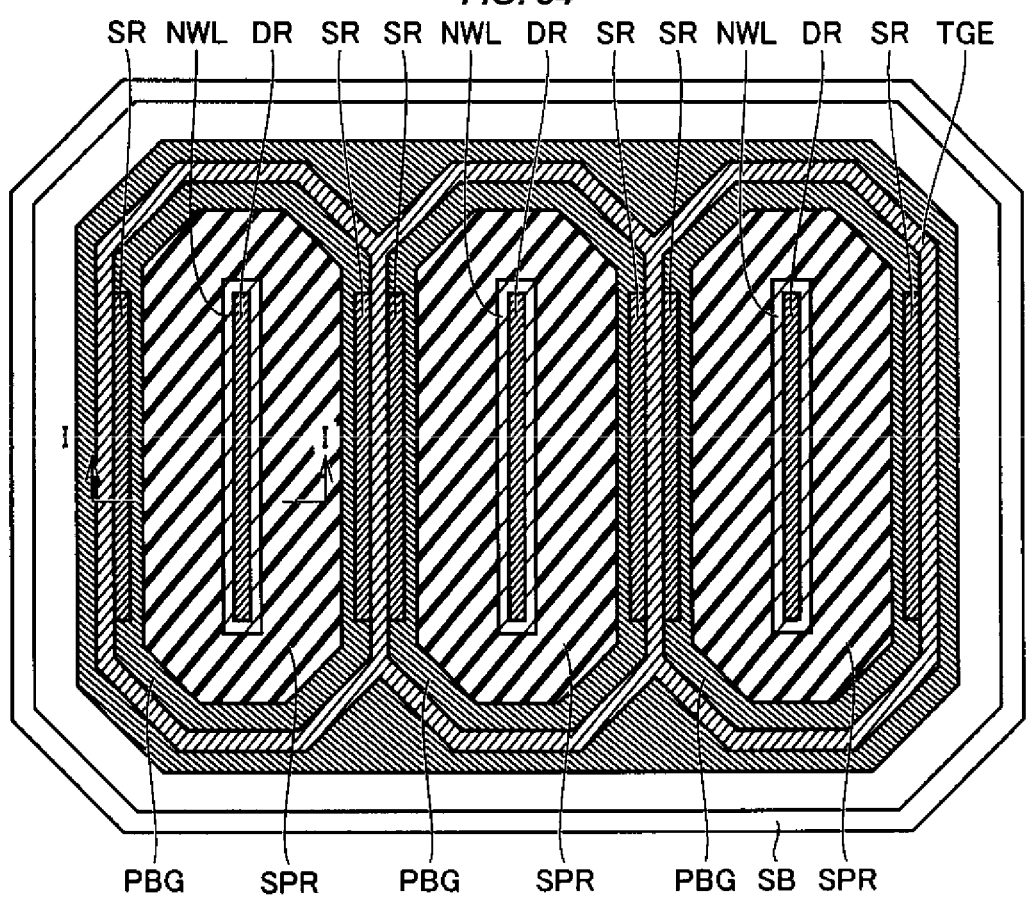
FIG. 34 is a plan view schematically illustrating a first example of a configuration in a planar view of the semiconductor device in FIG. 1.

Referring to FIG. 34, the portion along an I-I line in FIG. 34 is, for example, a portion having the configuration of the LDMOS transistor in the First Embodiment illustrated in the schematic section view in FIG. 1. As illustrated in FIG. 34, the source region SR, the p-type back gate region PBG, and the trench gate electrode TGE may be formed so as to surround the drain region DR and the n-type well region NWL on the periphery thereof, both being formed into the linear shape in a planar view.

Figure 35:
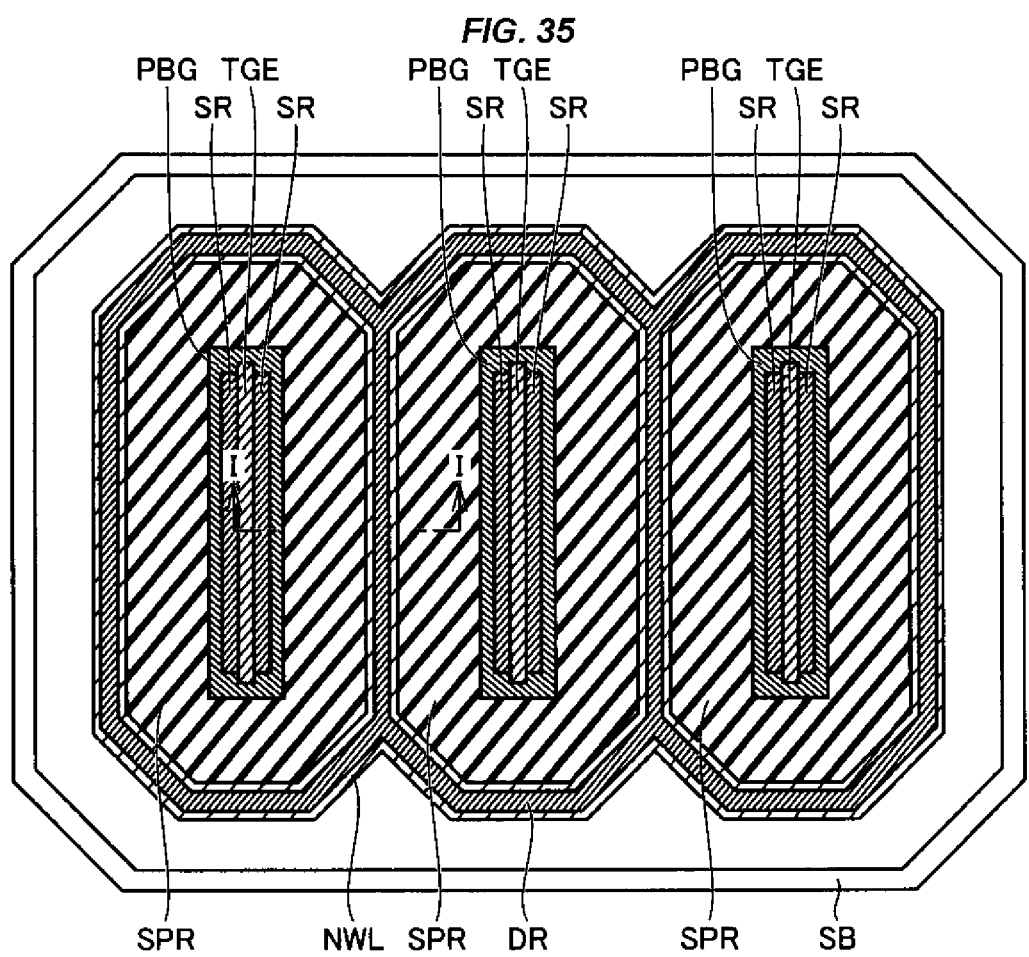
FIG. 35 is a plan view schematically illustrating a second example of the configuration in a planar view of the semiconductor device in FIG. 1.

Referring to FIG. 35, the portion along the I-I line in FIG. 35 is, for example, a portion having the configuration of the LDMOS transistor in the First Embodiment illustrated in the schematic section view in FIG. 1. As illustrated in FIG. 35, the drain region DR and the n-type well region NWL on the periphery thereof may be formed so as to surround the source region SR, the p-type back gate region PBG, and the trench gate electrode TGE, all being formed into the linear shape in a planar view.

Figure 36:
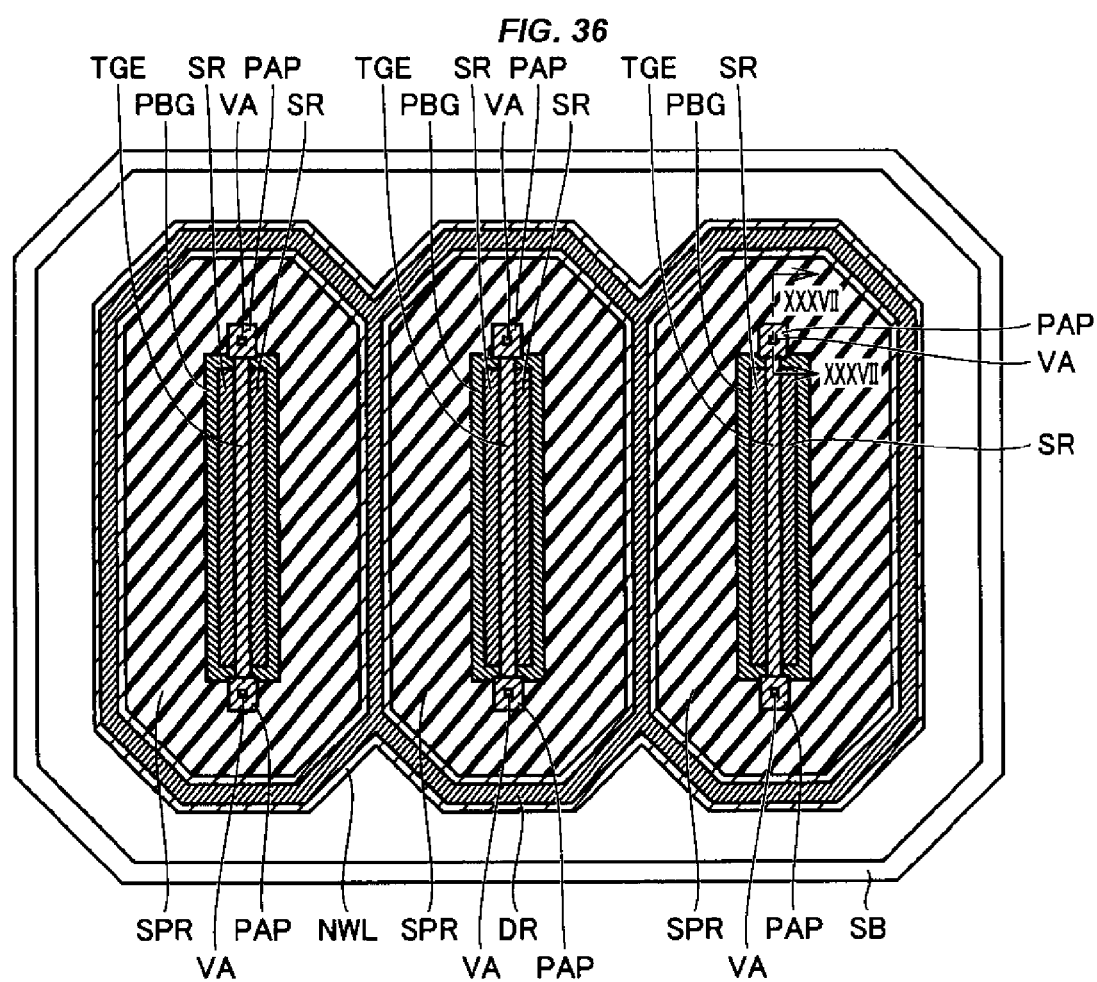
FIG. 36 is a plan view schematically illustrating a third example of the configuration in a planar view of the semiconductor device in FIG. 1, and a configuration of a semiconductor device according to an Eighth Embodiment.
Figure 37:
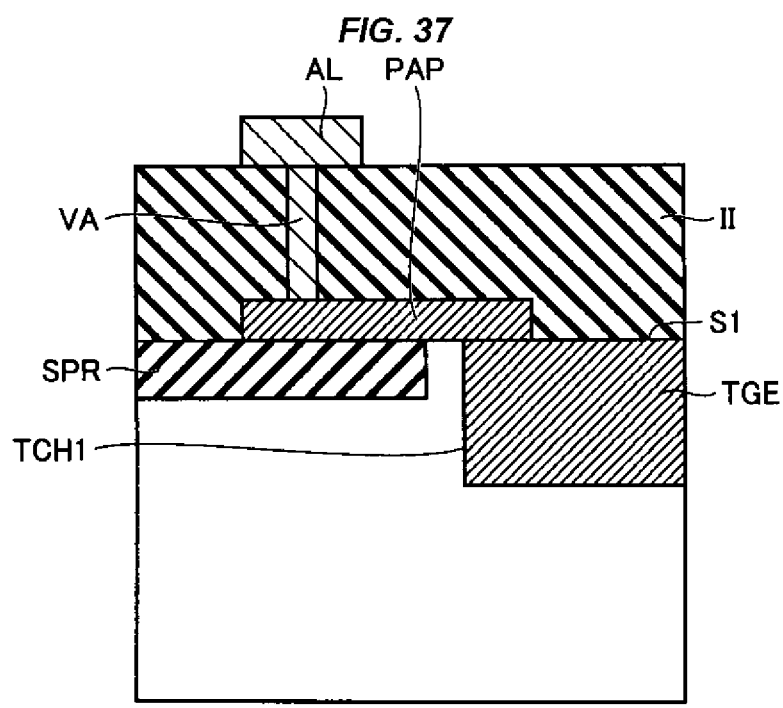
FIG. 37 is a section view schematically illustrating the configuration of the semiconductor device according to the Eighth Embodiment along an XXXVII-XXXVII line in FIG. 36.

Referring to FIG. 36 and FIG. 37, at the end part with respect to the extending direction in a planar view of the trench gate electrode TGE formed into the linear shape in FIG. 35, the conductive film (e.g., DOPOS) configuring the trench gate electrode TGE, which has overflowed from within the gate trench TCH1 so as to be continuous with the outside, may be formed as a pattern (pad part PAP) over the main surface S1 of the semiconductor substrate SUB. The via VA is formed in the interlayer insulating film II over the main surface S1 of the semiconductor substrate SUB so as to reach the top surface of the above-described pad part PAP and via this via VA, the pad part PAP and, for example, the metal wiring AL directly thereover are coupled electrically. With such configuration, the electrical coupling between the trench gate electrode TGE and the external metal wiring AL is further facilitated.

Figure 38:
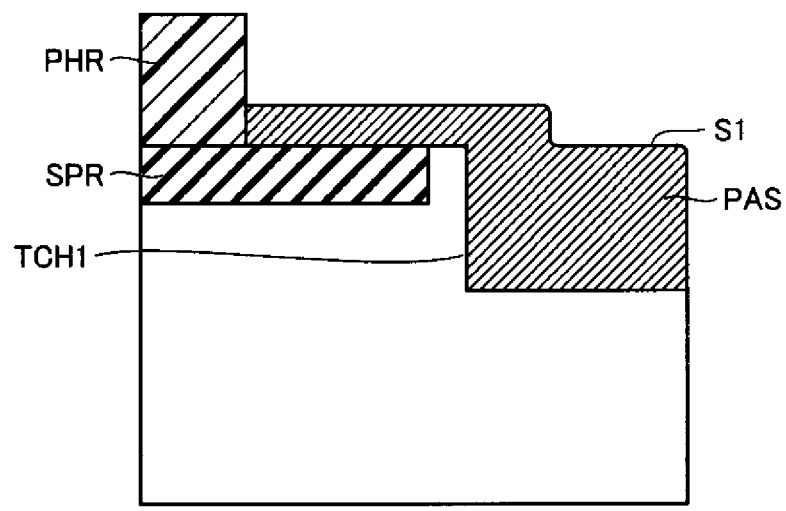
FIG. 38 is a schematic section view illustrating a first process of a method of manufacturing the semiconductor device according to the Eighth Embodiment.

Referring to FIG. 38, in the manufacturing method of the configuration in FIG. 37, in the process for forming the trench gate electrode TGE, the pad part PAP is formed over the one main surface S1 of the semiconductor substrate SUB so as to be continuous with the end part in a planar view of the trench gate electrode TGE. Because of this, the conductive film, such as DOPOS, is preferably formed and etched back so as to be continuous from within the gate trench TCH1 to part of the region over the main surface S1 of the semiconductor substrate SUB, which is the external region of the gate trench TCH1. Then, the via VA is formed so as to contact with the top surface of the pad part PAP.

(Ninth Embodiment)

Figure 39:
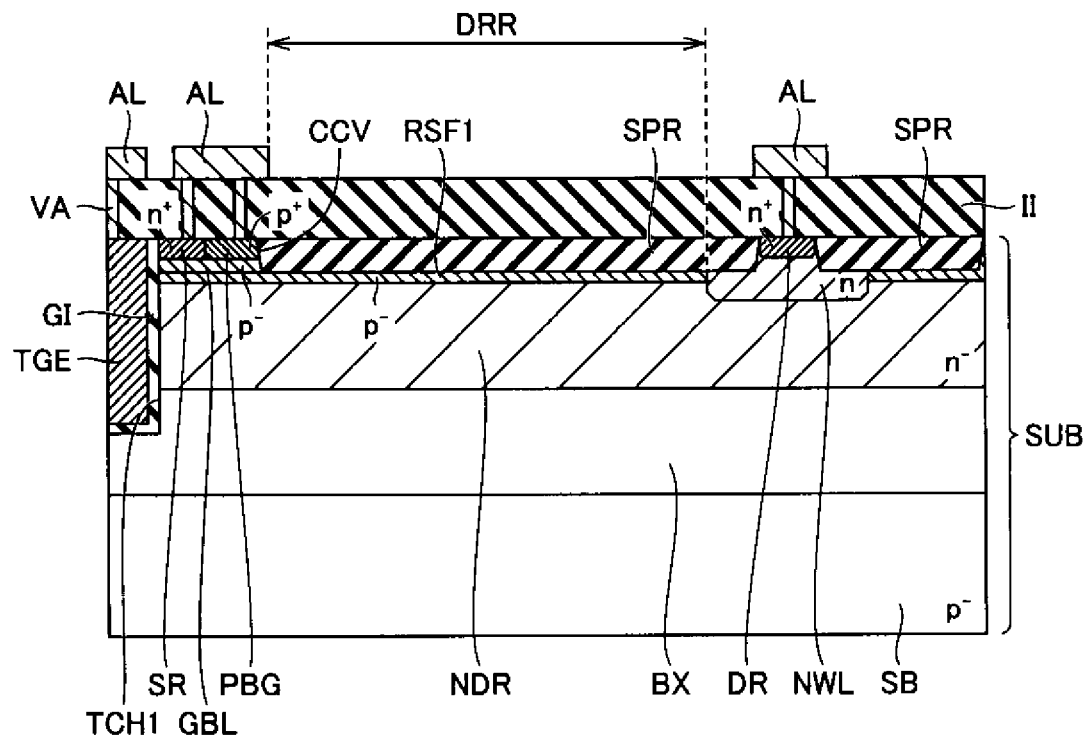
FIG. 39 is a section view schematically illustrating a configuration of a semiconductor device according to a Ninth Embodiment.

Referring to FIG. 39, in the present embodiment, compared to the LDMOS transistor in FIG. 1 in the First Embodiment, the different point is that the lower RESURF region in contact with the main surface S2 side (lower side) of the n-type drift region NDR is a buried insulating layer BX.

The buried insulating layer BX is formed so as to be buried within the semiconductor substrate SUB and on the upper side (main surface S1 side) thereof, a semiconductor region, such as the n-type drift region NDR, is formed. From this, it can be said that the semiconductor substrate SUB in the present embodiment is a so-called SOI (Silicon On Insulator).

The buried insulating layer BX includes, for example, a silicon oxide film, and preferably, has a thickness not less than 0.1 μm and not more than 2 μm. Further, the trench gate electrode TGE (gate trench TCH1) extending in the vertical direction in FIG. 39 from the main surface S1 of the semiconductor substrate SUB is preferably formed so as to penetrate through the n-type drift region NDR and reach the buried insulating layer BX.

In the present embodiment, the buried insulating layer BX is arranged as the lower RESURF region, and therefore, one of two depletion layers to be formed within the n-type drift region NDR as the double RESURF region DRR is formed between the buried insulating layer BX and the n-type drift region NDR.

In the present embodiment, because of the existence of the buried insulating layer BX, the electric field intensity between the n-type well region NWL on the periphery of the n-type drain region DR and the buried insulating layer BX directly thereunder is reduced, and therefore, the voltage in the region drops and a depletion layer becomes more likely to spread in the region. Because of this, it is possible to achieve further increase of the breakdown voltage in the region.

Further, in the present embodiment, by the buried insulating layer BX, the region on the main surface S1 side of the semiconductor substrate SUB (side on which the LDMOS transistor is formed) and the p-type substrate region SB lower than the buried insulating layer BX are separated electrically. Because of this, it is possible to apply the LDMOS transistor to a high side circuit.

Part of the other contents described in the embodiments are described below.

(1) The semiconductor device is a semiconductor device having a lateral insulating gate type field effect transistor. The semiconductor device includes the semiconductor substrate having one and the other main surfaces being opposed to each other, the lower RESURF region arranged within the semiconductor substrate, the first conductivity type first buried region formed so as to contact with the lower RESURF region on a side of the one main surface within the semiconductor substrate, and the second conductivity type upper RESURF region formed so as to contact with the first buried region on a side of the one main surface within the semiconductor substrate. The semiconductor substrate has the field oxide formed so as to reach the upper RESURF region on the one main surface. The semiconductor substrate includes the second conductivity type body region formed so as to contact with the upper RESURF region on a side of one main surface and so as to neighbor the field oxide within the semiconductor substrate. The semiconductor substrate has the gate trench formed so as to neighbor the body region and the upper RESURF region on the one main surface. Further, the semiconductor substrate includes the gate electrode of the insulating gate type field effect transistor formed within the gate trench so as to oppose the body region and the upper RESURF region via the gate insulating film. The lower RESURF region is the second conductivity type second buried region. The first conductivity type third buried region is formed so as to contact with the second buried region on a side of the other main surface. The semiconductor substrate further includes the element isolation gate trench formed so as to penetrate through the third buried region from the one main surface of the semiconductor substrate. The semiconductor substrate includes another transistor that is used under a voltage condition lower than that of the insulating gate type field effect transistor, which is located side by side with the insulating gate type field effect transistor with the element isolation trench being sandwiched in between.

(2) The semiconductor device is a semiconductor device having a lateral insulating gate type field effect transistor. The semiconductor device includes the semiconductor substrate having one and the other main surfaces being opposed to each other, the lower RESURF region arranged within the semiconductor substrate, the first conductivity type first buried region formed so as to contact with the lower RESURF region on a side of the one main surface within the semiconductor substrate, and the second conductivity type upper RESURF region formed so as to contact with the first buried region on a side of the one main surface within the semiconductor substrate. The semiconductor substrate has the field oxide formed so as to reach the upper RESURF region on the one main surface. The semiconductor substrate includes the second conductivity type body region formed so as to contact with the upper RESURF region on a side of one main surface and so as to neighbor the field oxide within the semiconductor substrate. The semiconductor substrate has the gate trench formed so as to neighbor the body region and the upper RESURF region on the one main surface. Further, the semiconductor substrate includes the gate electrode of the insulating gate type field effect transistor formed within the gate trench so as to oppose the body region and the upper RESURF region via the gate insulating film. On the one main surface of the semiconductor substrate, the source region is formed so as to contact with the body region and on the top surface of the edge part of the gate electrode on a side of the source region, the block insulating film is formed. On the one main surface of the semiconductor substrate, the back gate impurity region is formed so as to contact with the body region and so as to neighbor the source region. The silicide layer is formed so as to stride over both the top surfaces of the source region and the back gate impurity region. The via is connected to the silicide layer so as to reach the top surface of the silicide layer.

(3) The method of manufacturing the semiconductor device is a method of manufacturing the semiconductor device having a lateral insulating gate type field effect transistor. First, the semiconductor substrate having one and the other main surfaces being opposed to each other is prepared. The lower RESURF region and the first conductivity type first buried region in contact with the lower RESURF region on a side of the one main surface are formed within the semiconductor substrate. On the one main surface of the semiconductor substrate, the field oxide is formed so as to form the bottom part in the region shallower than the lowest part of the first buried region. The second conductivity type upper RESURF region is formed so as to contact with the first buried region on a side of the one main surface within the semiconductor substrate. The second conductivity type body region is formed so as to contact with the upper RESURF region on a side of one main surface and so as to neighbor the field oxide within the semiconductor substrate. On the one main surface of the semiconductor substrate, the gate trench that reaches at least the first buried region is formed so as to neighbor the body region and the upper RESURF region. Within the gate trench, the gate electrode of the insulating gate type field effect transistor is formed. The upper RESURF region and the body region are formed by introducing the second conductivity type impurities by using the same pattern as a mask. In the process for forming the gate electrode, the pad part is formed on the one main surface of the semiconductor substrate so as to be continuous with the end part in planar view of the gate electrode. The via is connected to the pad part so as to contact with the top surface of the pad part.

(4) The method of manufacturing the semiconductor device is a method of manufacturing the semiconductor device having a lateral insulating gate type field effect transistor. First, the semiconductor substrate having one and the other main surfaces being opposed to each other is prepared. The lower RESURF region and the first conductivity type first buried region in contact with the lower RESURF region on a side of the one main surface are formed within the semiconductor substrate. On the one main surface of the semiconductor substrate, the field oxide is formed so as to form the bottom part in the region shallower than the lowest part of the first buried region. The second conductivity type upper RESURF region is formed so as to contact with the first buried region on a side of the one main surface within the semiconductor substrate. The second conductivity type body region is formed so as to contact with the upper RESURF region on a side of one main surface and so as to neighbor the field oxide within the semiconductor substrate. On the one main surface of the semiconductor substrate, the gate trench that reaches at least the first buried region is formed so as to neighbor the body region and the upper RESURF region. Within the gate trench, the gate electrode of the insulating gate type field effect transistor is formed. The upper RESURF region and the body region are formed by introducing the second conductivity type impurities by using the same pattern as a mask. The lower RESURF region is the second conductivity type second buried region. On the one main surface of the semiconductor substrate, the well region planarly surrounding the drain region and the drain electrode is further formed. The upper RESURF region and the second buried region are formed so as to have the cutout part in the region planarly overlapping the well region. The first conductivity type third buried region is formed so as to contact with the other main surface side of the second buried region.

As above, the invention made by the inventors of the present invention is explained specifically based on the embodiments, but the present invention is not limited to the above-described embodiments and it is needless to say that there can be various kinds of modifications in the scope not deviating from its gist.

What is claimed is:

1. A semiconductor device having a lateral insulating gate type field effect transistor, the semiconductor device comprising:
   a semiconductor substrate having one and the other main surfaces being opposed to each other;
   a lower RESURF region arranged within the semiconductor substrate;

a first conductivity type first buried region formed within the semiconductor substrate to contact with the lower RESURF region on a side of the lower RESURF region facing the one main surface; and a second conductivity type upper RESURF region formed within the semiconductor substrate to contact with the first buried region on a side of the first buried region facing the one main surface, wherein the semiconductor substrate has a field oxide formed so as to reach the upper RESURF region on a side of the upper RESURF region facing the one main surface, and includes a second conductivity type body region formed so as to contact with the upper RESURF region on a side of the upper RESURF region facing toward the one main surface and directly adjacent to the field oxide on a different side, and wherein the semiconductor substrate has a gate trench formed directly adjacent to the body region and a surface of the upper RESURF region, and further includes a gate electrode of the insulating gate type field effect transistor formed within the gate trench so as to oppose the body region and the upper RESURF region via a gate insulating film.

2. The semiconductor device according to claim 1, wherein if a first conductivity type doping concentration in the first buried region is taken to be Nd (cm$^{-3}$) and a depth of the first buried region is taken to be dn (cm), $4\times10^{12} \leq Nd \times dn \leq 8\times10^{12}$ holds, and wherein if a second conductivity type doping concentration in the upper RESURF region is taken to be Na1 (cm$^{-3}$) and a depth of the upper RESURF region is taken to be dp1 (cm), $2\times10^{12} \leq Na1 \times dp1 \leq 4\times10^{12}$ holds.

3. The semiconductor device according to claim 1, wherein a source region is formed so as to contact with the body region on the one main surface of the semiconductor substrate, and wherein a block insulating film is formed on a top surface of an edge part of the gate electrode on a side of the source region.

4. The semiconductor device according to claim 1, wherein an edge part of the gate trench is rounded so that a width of the gate electrode becomes larger toward a side of the one main surface.

5. The semiconductor device according to claim 1, wherein the gate electrode has a shape in which the gate electrode partially rides over the one main surface from within the gate trench, and wherein a portion of the gate electrode located over the one main surface has a width larger than that of a portion of the gate electrode located within the gate trench.

6. The semiconductor device according to claim 1, wherein the lower RESURF region is a buried insulating layer.

7. The semiconductor device according to claim 1, wherein the lower RESURF region is a second conductivity type second buried region.

8. The semiconductor device according to claim 7, wherein the gate trench is formed so as to reach the lower RESURF region as the second buried region.

9. The semiconductor device according to claim 7, wherein a first conductivity type third buried region is formed so as to contact with the other main surface of the second buried region.

10. The semiconductor device according to claim 9, further comprising an element isolation gate trench formed so as to penetrate through the third buried region from the one main surface of the semiconductor substrate.

11. The semiconductor device according to claim 7, wherein a drain region and a well region planarly surrounding the drain region are formed on the one main surface of the semiconductor substrate, and wherein the second buried region is formed so as to avoid a region directly under the well region.

12. The semiconductor device according to claim 11, wherein the well region is formed so as to penetrate through the upper RESURF region to reach within the first buried region and so as to have a bottom part in a region shallower than a region closest to the other main surface of the first buried region.

13. The semiconductor device according to claim 7, wherein if a first conductivity type doping concentration in the first buried region is taken to be Nd (cm$^{-3}$) and a depth of the first buried region is taken to be dn (cm), $4\times10^{12} \leq Nd \times dn \leq 8\times10^{12}$ holds, wherein if a second conductivity type doping concentration in the upper RESURF region is taken to be Na1 (cm$^{\times 3}$) and a depth of the upper RESURF region is taken to be dp1(cm), $2\times10^{12} \leq Na1 \times dp1 \leq 4\times10^{12}$ holds, and wherein if a second conductivity type doping concentration in the lower RESURF region is taken to be Na2 (cm$^{-3}$) and a depth of the lower RESURF region is taken to be dp2 (cm), $2\times10^{12} \leq Na2 \times dp2 \leq 4\times10^{12}$ holds.

14. The semiconductor device according to claim 7, comprising a pad part on the one main surface of the semiconductor substrate so as to be continuous with an end part in a planar view of the gate electrode, wherein a via is connected to the pad part so as to reach a top surface of the pad part.

15. A method of manufacturing a semiconductor device having a lateral insulating gate type field effect transistor, comprising the steps of:

preparing a semiconductor substrate having one and the other main surfaces being opposed to each other;

forming a lower RESURF region, and a first conductivity type first buried region within the semiconductor substrate and in contact with the lower RESURF region on a side of the lower RESURF region facing the one main surface;

forming a field oxide on the one main surface of the semiconductor substrate so as to form a bottom part in a region shallower than a lowest part of the first buried region;

forming a second conductivity type upper RESURF region within the semiconductor substrate to contact with the first buried region on a side of the first buried region facing the one main surface;

forming a second conductivity type body region within the semiconductor substrate so as to contact with the upper RESURF region on a side of the upper RESURF region facing toward one main surface and directly adjacent to the field oxide;

forming a gate trench that reaches at least the first buried region directly adjacent to the body region and the upper RESURF region; and forming a gate electrode of the insulating gate type field effect transistor within the gate trench, wherein in the step of forming the upper RESURF region and in the step of forming the body region, the same pattern is used as a mask and second conductivity type impurities are introduced.

16. The method of forming a semiconductor device according to claim 15, wherein the upper RESURF region and the body region are formed simultaneously by a same ion implantation.

17. The method of forming a semiconductor device according to claim 15,
wherein the upper RESURF region and the body region are formed separately by ion implantations different from each other.

18. The method of forming a semiconductor device according to claim 15,
wherein in the step of forming the gate trench, an etching is performed so that a width of the gate trench becomes larger toward the one main surface and an edge part of the gate trench is rounded.

19. The method of forming a semiconductor device according to claim 15,
wherein the step of forming the gate electrode includes the steps of:
forming a conductive film over the one main surface so as to fill in at least a portion in the gate trench; and
patterning the conductive film so as to have a shape in which the conductive film partially rides over the one main surface from within the gate trench by a resist pattern having a width larger than a width of the gate trench.

20. The method of forming a semiconductor device according to claim 15,
wherein the lower RESURF region is a second conductivity type second buried region,
wherein the method further includes the step of forming a drain region and a well region planarly surrounding the drain region on the one main surface of the semiconductor substrate, and
wherein the upper RESURF region and the second buried region are formed so as to have a cutout part in a region planarly overlapping the well region.

* * * * *